(12) United States Patent
Mochizuki

(10) Patent No.: US 9,170,477 B2
(45) Date of Patent: *Oct. 27, 2015

(54) LIGHT EMITTING DEVICE AND SUPER-LUMINESCENT DIODE HAVING LAYER WITH FIRST, SECOND AND THIRD WAVEGUIDES

(71) Applicant: Seiko Epson Corporation, Tokyo (JP)

(72) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/539,230

(22) Filed: Nov. 12, 2014

(65) Prior Publication Data

US 2015/0070899 A1 Mar. 12, 2015

Related U.S. Application Data

(63) Continuation of application No. 13/597,847, filed on Aug. 29, 2012, now Pat. No. 8,911,093.

(30) Foreign Application Priority Data

Aug. 31, 2011 (JP) ................................. 2011-189231

(51) Int. Cl.
*G03B 21/20* (2006.01)
*G02B 6/42* (2006.01)
*H01L 33/00* (2010.01)

(52) U.S. Cl.
CPC ............ *G03B 21/208* (2013.01); *G02B 6/4298* (2013.01); *G03B 21/2033* (2013.01); *H01L 33/0045* (2013.01); *G02B 6/4214* (2013.01)

(58) Field of Classification Search
CPC .............. G03B 21/20; G03B 21/2006; G03B 21/2033; G03B 21/208; H01L 33/0045; H01L 33/02; H01L 33/20; H01L 33/26; H01L 33/28; G02B 6/4214; G02B 6/4298; G02B 19/0057; G02B 19/0066; G02B 27/0944
See application file for complete search history.

(56) References Cited

U.S. PATENT DOCUMENTS

| 6,399,407 B1 | 6/2002 | O'Brien et al. |
| 7,369,583 B2 | 5/2008 | Ledentsov et al. |
| 7,436,873 B2 | 10/2008 | Sugitatsu et al. |
| 2003/0020074 A1 | 1/2003 | Macomber et al. |
| 2010/0155759 A1 | 6/2010 | Nagawa |

(Continued)

FOREIGN PATENT DOCUMENTS

| JP | 2009-267119 A | 11/2009 |
| JP | 2010-003833 A | 1/2010 |

(Continued)

*Primary Examiner* — Jori S Reilly-Diakun
(74) *Attorney, Agent, or Firm* — Harness, Dickey & Pierce, P.L.C.

(57) ABSTRACT

A light emitting device includes a first layer that generates light by an injection current, the first layer is provided with a first optical waveguide extending from a first light emitting section disposed on a first side surface to a first light reflecting section disposed on a second side surface, a second optical waveguide extending from the first light reflecting section to a second light reflecting section disposed on a third side surface, and a third optical waveguide extending from the second light reflecting section to a second light emitting section disposed on the first side surface, and an element of the group II or the group XII is diffused in the first light reflecting section and the second light reflecting section.

16 Claims, 10 Drawing Sheets

(56) References Cited

U.S. PATENT DOCUMENTS

| | | |
|---|---|---|
| 2010/0187966 A1 | 7/2010 | Mochizuki |
| 2010/0238966 A1* | 9/2010 | Mochizuki ............... 372/99 |
| 2011/0026108 A1 | 2/2011 | Takahashi et al. |
| 2012/0229773 A1 | 9/2012 | Mochizuki |
| 2012/0229774 A1 | 9/2012 | Mochizuki |
| 2012/0235196 A1 | 9/2012 | Mochizuki |
| 2013/0301012 A1 | 11/2013 | Mochizuki |

FOREIGN PATENT DOCUMENTS

| | | |
|---|---|---|
| JP | 2010-016172 A | 1/2010 |
| JP | 2010-245469 A | 10/2010 |
| JP | 2010-278131 A | 12/2010 |
| JP | 2011-123405 A | 6/2011 |
| JP | 2011-155103 A | 8/2011 |

* cited by examiner

LIGHT EMITTING DEVICE AND SUPER-LUMINESCENT DIODE HAVING LAYER WITH FIRST, SECOND AND THIRD WAVEGUIDES

CROSS-REFERENCE TO RELATED APPLICATIONS

This is a continuation patent application of U.S. application Ser. No. 13/597,847 filed Aug. 29, 2012 which claims priority to Japanese Patent Application No. 2011-189231 filed Aug. 31, 2011, all of which are incorporated by reference herein in their entireties.

BACKGROUND

1. Technical Field

The present invention relates to a light emitting device, a super-luminescent diode, and a projector.

2. Related Art

A super-luminescent diode (hereinafter also referred to as an "SLD") is a semiconductor light emitting device capable of providing an output up to several hundreds of mW with a single device similarly to a semiconductor laser, while showing a broadband spectrum and thus being incoherent shape similarly to an ordinary light emitting diode.

The SLD can be used as, for example, alight source of a projector, and for realizing a small-sized and high-brightness projector, it is required to use a light source with high light output and low etendue. In order to achieve this, it is preferable that the lights emitted from a plurality of gain regions travel in the same direction. In JP-A-2010-3833 (Document 1), by combining the gain region having a linear shape and the gain region having a winded shape at a reflection surface, the lights respectively emitted from the light emitting sections of the two gain regions are made to proceed in the same direction.

To reduce loss of the optical system and number of optical components, there has been proposed a type of a projector that can perform light collection (including light collimation or reduction in diffusion angle of light) and uniform illumination at the same time by providing the SLD immediately below the light valve and using a lens array. In the projector of that type described above, it is required to provide the light emitting sections in accordance with the intervals of the lens array. In the technology described in Document 1, it is difficult to arrange the plurality of light emitting sections with intervals corresponding to a variety of lens arrays with different pitches, and therefore, it is not achievable to apply the technology to the projector of the type described above.

SUMMARY

An advantage of some aspects of the invention is to provide a light emitting device having a plurality of light emitting sections of which the intervals can be enlarged, which can be applied to a type of a projector having the light emitting device disposed immediately below the light valve. Another advantage of some aspects of the invention is to provide a projector having the light emitting device described above.

A light emitting device according to an aspect of the invention includes a first layer that generates light by an injection current, and a second layer and a third layer that sandwich the first layer and suppress leakage of the light, the first layer is provided with a first optical waveguide having a belt-like shape extending from a first light emitting section disposed on a first side surface of the first layer to a first light reflecting section disposed on a second side surface of the first layer, a second optical waveguide having a belt-like shape extending from the first light reflecting section to a second light reflecting section disposed on a third side surface of the first layer, and a third optical waveguide having a belt-like shape extending from the second light reflecting section to a second light emitting section disposed on the first side surface, an extending direction of the second optical waveguide is parallel to an in-plane direction of the first side surface, an element of the group II or the group XII is diffused in the first light reflecting section and the second light reflecting section, and a first light emitted from the first light emitting section and a second light emitted from the second light emitting section travel in the same direction.

According to such a light emitting device, the second optical waveguide is disposed from the second side surface to the third side surface in parallel to the in-plane direction of the first side surface provided with the first light emitting section and the second light emitting section. Therefore, it is possible to increase the distance between the first light emitting section and the second light emitting section while preventing the total length of the optical waveguide from increasing compared to the case in which, for example, the second optical waveguide is nonparallel to the in-plane direction of the first side surface. In other words, it is possible to increase the distance between the first light emitting section and the second light emitting section while achieving the downsizing of the device length in a direction perpendicular to the side surface provided with the first light emitting section and the second light emitting section. Thereby, downsizing of the entire device can also be realized, and thus waste of resources can be suppressed and manufacturing cost can be reduced.

Further, according to such a light emitting device, an element of the group II or the group XII is diffused in the first light reflecting section and the second light reflecting section. Thus, in the first light reflecting section and the second light reflecting section, bandgap of a quantum well included in the first layer can be made wider than that of the other part of the first layer where the element of the group II or the group XII is not diffused. As a result, the reabsorption of the light in the quantum well can be suppressed in the first light reflecting section and the second light reflecting section, and thus, the catastrophic optical damage (COD) in the first light reflecting section and the second light reflecting section can be suppressed.

In the light emitting device according to the above aspect of the invention, a surface of each of the first light reflecting section and the second light reflecting section may be covered by a dielectric layer.

According to such a light emitting device, apart of the dangling bond appearing on the surfaces of the first light reflecting section and the second light reflecting section can be terminated. Thereby, heat generation caused by non-radiative recombination can be suppressed. Thus, the minimum light output power causing the COD (the COD level) can be increased.

In the light emitting device according to the above aspect of the invention, a resin layer may be formed on an opposite side of the dielectric layer to each of the first light reflecting section and the second light reflecting section.

According to such a light emitting device, a concave section formed when forming first light reflecting section and the second light reflecting section can be filled in a short time.

In the light emitting device according to the above aspect of the invention, a surface of each of the first light reflecting section and the second light reflecting section may be exposed. According to such a light emitting device, it is possible to increase the distance between the first light emitting section and the second light emitting section while achieving downsizing.

The light emitting device according to the above aspect of the invention may further include a first electrode electrically connected to the second layer, a second electrode electrically connected to the third layer, and a fourth layer disposed between the third layer and the second electrode, and having ohmic contact with the second electrode, and when viewed from a stacking direction of the first layer, the second layer, and the third layer, a shortest distance between the first light reflecting section and an end portion of a contact surface between the second electrode and the fourth layer may be 20 µm or longer, and a shortest distance between the second light reflecting section and the end portion of the contact surface may be 20 µm or longer.

According to such a light emitting device, diffusion current can be prevented from reaching the first light reflecting section and the second light reflecting section. Thereby, heat generation caused by non-radiative recombination can be prevented or suppressed. Thus, the COD in the first light reflecting section and the second light reflecting section can further be suppressed.

In the light emitting device according to the above aspect of the invention, when viewed from a stacking direction of the first layer, the second layer, and the third layer, the first optical waveguide and the second optical waveguide may be connected to the first light reflecting section while being tilted at a first angle with a perpendicular of the second side surface, the second optical waveguide and the third optical waveguide may be connected to the second light reflecting section while being tilted at a second angle with a perpendicular of the third side surface, and the first angle and the second angle may be equal or larger than a critical angle.

According to such a light emitting device, the first light reflecting section and the second light reflecting section are capable of totally reflecting the lights generated in the first optical waveguide, the second optical waveguide, and the third optical waveguide. Therefore, the light loss in the first light reflecting section and the second light reflecting section can be suppressed, and thereby, the lights can be efficiently be reflected.

In the light emitting device according to the above aspect of the invention, it is also possible that a length of the second optical waveguide in an extending direction thereof is longer than that of the first optical waveguide and that of the third optical waveguide.

According to such a light emitting device, it is possible to surely increase the distance between the first light emitting section and the second light emitting section.

In the light emitting device according to the above aspect of the invention, each of the second side surface and the third side surface may be an etched surface formed by etching.

According to such a light emitting device, even in the etched surface where the dangling bonds are apt to be formed, the COD can be suppressed by widening the bandgap of the first light reflecting section and the second light reflecting section.

In the light emitting device according to the above aspect of the invention, the element may be zinc.

According to such a light emitting device, it is possible to preferably diffuse zinc into the first layer.

A light emitting device according to another aspect of the invention includes an active layer, and a first cladding layer and a second cladding layer sandwiching the active layer, the active layer is provided with a first gain region having a belt-like shape extending from a first light emitting section disposed on a first side surface of the active layer to a first light reflecting section disposed on a second side surface of the active layer, a second gain region having a belt-like shape extending from the first light reflecting section to a second light reflecting section disposed on a third side surface of the active layer, and a third gain region having a belt-like shape extending from the second light reflecting section to a second light emitting section disposed on the first side surface, an extending direction of the second gain region is parallel to an in-plane direction of the first side surface, an element of the group II or the group XII is diffused in the first light reflecting section and the second light reflecting section, and a first light emitted from the first light emitting section and a second light emitted from the second light emitting section travel in the same direction.

According to such a light emitting device, it is possible to increase the distance between the first light emitting section and the second light emitting section while achieving downsizing.

A projector according to still another aspect of the invention includes the light emitting device according to any one of the above aspects of the invention, a lens array that reduces a diffusion angle of the light emitted from the light emitting device, a light modulation device that modulates the light reduced the diffusion angle by the lens array in accordance with image information, and a projection device that projects the image formed by the light modulation device.

According to such a projector, alignment of the lens arrays is easy, and the light modulation device (such as liquid crystal light valve) can be uniformly irradiated.

A super-luminescent diode according to yet another aspect of the invention includes a first layer that generates light by an injection current, and a second layer and a third layer that sandwich the first layer and suppress leakage of the light, the first layer is provided with a first optical waveguide having a belt-like shape extending from a first light emitting section disposed on a first side surface of the first layer to a first light reflecting section disposed on a second side surface of the first layer, a second optical waveguide having a belt-like shape extending from the first light reflecting section to a second light reflecting section disposed on a third side surface of the first layer, and a third optical waveguide having a belt-like shape extending from the second light reflecting section to a second light emitting section disposed on the first side surface, an extending direction of the second optical waveguide is parallel to an in-plane direction of the first side surface, an element of the group II or the group XII is diffused in the first light reflecting section and the second light reflecting section, and a first light emitted from the first light emitting section and a second light emitted from the second light emitting section travel in the same direction.

According to such a super-luminescent diode, it is possible to increase the distance between the first light emitting section and the second light emitting section while achieving downsizing.

A projector according to still yet another aspect of the invention includes the super-luminescent diode according to the above aspect of the invention, a lens array that reduces a diffusion angle of the light emitted from the super-luminescent diode, a light modulation device that modulates the light reduced the diffusion angle by the lens array in accordance with image information, and a projection device that projects the image formed by the light modulation device.

According to such a projector, the alignment of the lens arrays is easy, and the light modulation device (such as liquid crystal light valve) can be uniformly irradiated.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some exemplary embodiments of the invention will hereinafter be described with reference to the accompanying drawings.

1. Light Emitting Device

Figure 1:
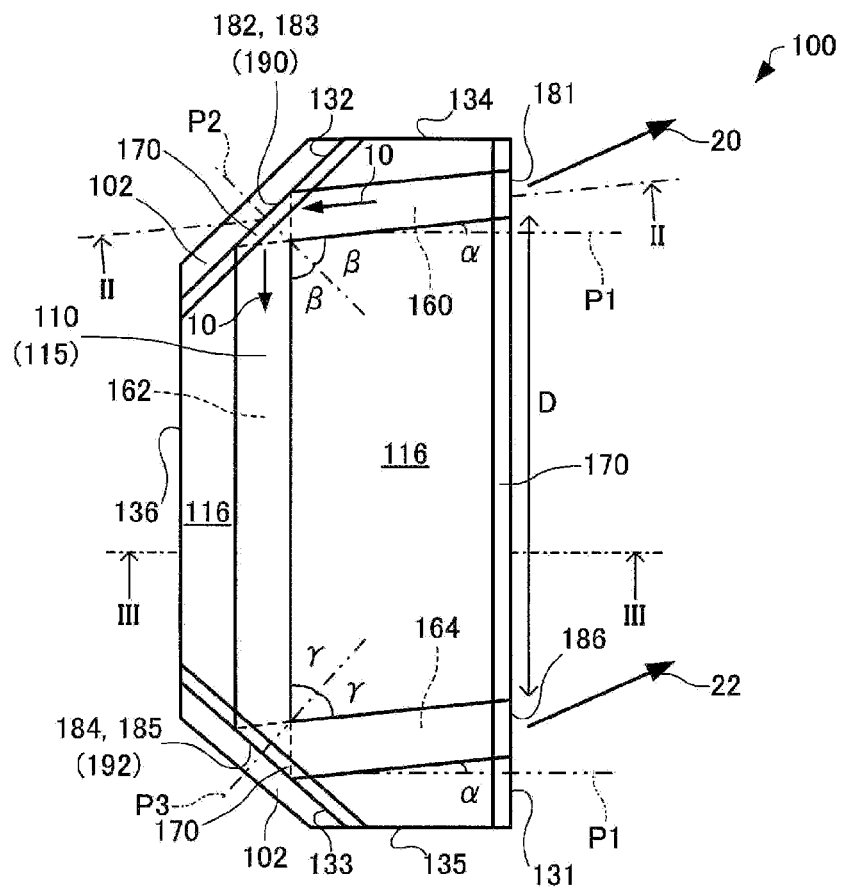
FIG. 1 is a plan view schematically showing the light emitting device according to an embodiment of the invention.
Figure 2:
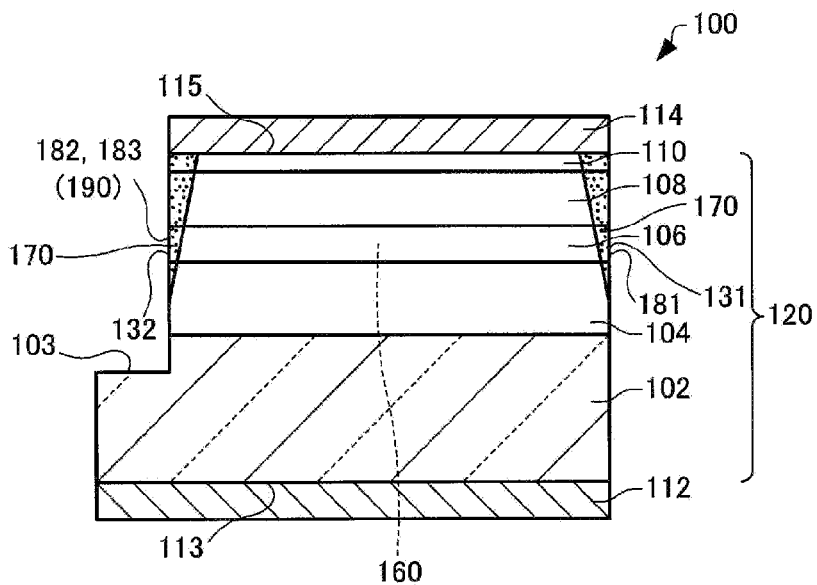
FIG. 2 is a cross-sectional view schematically showing the light emitting device according to the embodiment.
Figure 3:
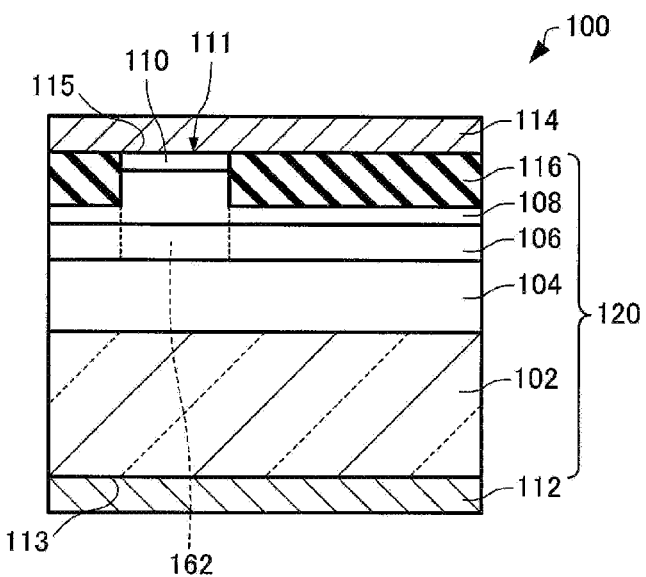
FIG. 3 is a cross-sectional view schematically showing the light emitting device according to the embodiment.

Firstly, a light emitting device according to the present embodiment will be explained with reference to the accompanying drawings. FIG. 1 is a plan view schematically showing the light emitting device 100 according to the present embodiment. FIG. 2 is a cross-sectional view along the line II-II shown in FIG. 1, and schematically shows the light emitting device 100 according to the present embodiment. FIG. 3 is a cross-sectional view along the line III-III shown in FIG. 1, and schematically shows the light emitting device 100 according to the present embodiment. It should be noted that in FIG. 1, a second electrode 114 is omitted from drawing for the sake of convenience.

The case in which the light emitting device 100 is an SLD of the InGaAlP type (red) will be explained below. Unlike the semiconductor laser, in the SLD, laser oscillation can be prevented or suppressed by preventing formation of a resonator due to end surface reflection. Therefore, the speckle noise can be reduced.

As shown in FIGS. 1 through 3, the light emitting device 100 can include a laminated body 120, a first electrode 112, and the second electrode 114.

The laminated body 120 can include a substrate 102, a second layer 104 (hereinafter also referred to as a "first cladding layer 104"), a first layer 106 (hereinafter also referred to as an "active layer 106"), a third layer 108 (hereinafter also referred to as a "second cladding layer 108"), a fourth layer 110 (hereinafter also referred to as a "contact layer 110"), and an insulating layer 116.

As the substrate 102, a first conductivity type (e.g., an n-type) GaAs substrate, for example, can be used. As shown in FIGS. 1 and 2, the substrate 102 can have a step surface 103. The step surface 103 can be formed by etching for exposing light reflecting sections 190, 192 described later (for exposing side surfaces 132, 133).

The first cladding layer 104 is formed on the substrate 102 (on the upper surface of the substrate 102 except the step surface 103). As the first cladding layer 104, an n-type InGaAlP layer, for example, can be used. It should be noted that although not shown in the drawings, it is also possible to form a buffer layer between the substrate 102 and the first cladding layer 104. As the buffer layer, an n-type GaAs layer, an n-type AlGaAs layer, an n-type InGaP layer, or the like can be used. The buffer layer is capable of improving the crystal quality of the layer to be formed above it.

The active layer 106 is formed on the first cladding layer 104. The active layer 106 is sandwiched between the first cladding layer 104 and the second cladding layer 108. The active layer 106 has a single quantum well (SQW) structure or a multiple quantum well (MQW) structure having, for example, three quantum well structures stacked one another each composed of an InGaP well layer and an InGaAlP barrier layer.

The planar shape of the active layer 106 viewed from the stacking direction of the laminated body 120 is the same as the planar shape of, for example, the cladding layers 104, 108, and the contact layer 110. In the example shown in FIG. 1, the planar shape of the active layer 106 is a hexagonal shape, and has a first side surface 131, a second side surface 132, a third side surface 133, a fourth side surface 134, a fifth side surface 135, and a sixth side surface 136. The side surfaces 131 through 136 are surfaces of the active layer 106, do not have in-plane contact with the first cladding layer 104 or the second cladding layer 108, and form the outer shape of the laminated body 120. It can also be said that the side surfaces 131 through 136 are the sidewalls of the active layer 106 and are disposed on the side surface sections of the laminated body 120 viewed from the stacking direction of the laminated body 120 (viewed from the stacking direction of the active layer 106, and the cladding layers 104, 108, hereinafter also described simply as "in the plan view"). Each of the side surfaces 131 through 136 can be a flat surface.

In the example shown in FIG. 1, the side surfaces 134, 135 are perpendicular to the side surface 131. The side surface 136 is opposed to the side surface 131. The side surface 132 is connected to the side surfaces 134, 136, and is tilted with respect to the side surface 131. The side surface 133 is connected to the side surfaces 135, 136, and is also tilted with respect to the side surface 131. For example, the side surfaces 131, 134, 135, and 136 are surfaces formed by cleavage, while the side surfaces 132, 133 are formed by etching.

Part of the active layer 106 constitutes a first optical waveguide 160, a second optical waveguide 162, and a third optical waveguide 164. The portions of the optical waveguides 160, 162, and 164 to which an electrical current is injected can generate light. The light thus generated can be guided through the optical waveguides 160, 162, and 164. The light guided through the optical waveguides 160, 162, and 164 can be amplified in the portions of the optical waveguides 160, 162, and 164 to which electrical current is injected.

In the example shown in the drawings, the second electrode 114 is formed on the entire top surface of the contact layer 110 and the insulating layer 116, and the whole of the optical waveguides 160, 162, and 164 is sandwiched between the first electrode 112 and the second electrode 114. More specifically, the whole of the optical waveguides 160, 162, and 164 is sandwiched between the contact surface 113 between the first electrode 112 and the substrate 102, and the contact surface 115 between the second electrode 114 and the contact layer 110. Therefore, electrical current can be injected in any part of the optical waveguides 160, 162, and 164, and light can be amplified. It can also be said that, in the light emitting device 100, part of the active layer 106 constitutes a first gain region 160, a second gain region 162, and a third gain region 164.

The first optical waveguide 160 extends from the first side surface 131 to the second side surface 132 in the plan view. In the plan view, the first optical waveguide 160 has a predetermined width, and is provided with a belt-like linear longitudinal shape along the extending direction of the first optical waveguide 160. The first optical waveguide 160 has a first end surface 181 provided on the first side surface 131 and a second end surface 182 provided on the second side surface 132.

It should be noted that the extending direction of the first optical waveguide 160 denotes, for example, the extending direction of a straight line passing through the center of the first end surface 181 and the center of the second end surface 182 in the plane view. Further, it can also be the extending direction of a boundary line of the first optical waveguide 160 (with the portion except the first optical waveguide 160).

The first optical waveguide 160 is connected to the first side surface 131 and is tilted at an angle α with the perpendicular P1 of the first side surface 131 in the plan view. In other words, it can be said that the extending direction of the first optical waveguide 160 has an angle α with the perpendicular P1. The angle α is a acute angle, and is smaller than the critical angle. It should be noted that the first optical waveguide 160 can also be parallel (α=0°) to a perpendicular P1 of the first side surface 131.

The first optical waveguide 160 is connected to the second side surface 132 and is tilted at an angle β with the perpendicular P2 of the second side surface 132 in the plan view. In other words, it can be said that the extending direction of the first optical waveguide 160 has an angle β with the perpendicular P2. The second optical waveguide 162 extends from the second side surface 132 to the third side surface 133 in the plan view. In the plan view, the second optical waveguide 162 has a predetermined width, and is provided with a belt-like linear longitudinal shape along the extending direction of the second optical waveguide 162. The second optical waveguide 162 has a third end surface 183 provided on the second side surface 132 and a fourth end surface 184 provided on the third side surface 133. In the plan view, the extending direction of the second optical waveguide 162 is parallel to the in-plane direction of the first side surface 131.

It should be noted that the extending direction of the second optical waveguide 162 denotes, for example, the extending direction of a straight line passing through the center of the third end surface 183 and the center of the fourth end surface 184 in the plane view. Further, it can also be the extending direction of a boundary line of the second optical waveguide 162 (with the portion except the second optical waveguide 162). Further, the sentence that "the extending direction of the second optical waveguide 162 is parallel to the first side surface 131" denotes that the tilt angle of the second optical waveguide 162 with respect to the first side surface 131 is within ±1° in the plan view taking the production tolerance into consideration. The third end surface 183 of the second optical waveguide 162 overlaps with the second end surface 182 of the first optical waveguide 160 on the second side surface 132. In the example shown in the drawing, the second end surface 182 and the third end surface 183 completely overlap with each other in an overlapping plane 190.

The second optical waveguide 162 is connected to the second side surface 132 and is tilted at an angle β with the perpendicular P2 of the second side surface 132 in the plan view. In other words, it can be said that the extending direction of the second optical waveguide 162 has an angle β with the perpendicular P2. That is, the angle of the first optical waveguide 160 with respect to the perpendicular P2 and the angle of the second optical waveguide 162 with respect to the perpendicular P2 are the same within the range of the production tolerance. The angle β is, for example, an acute angle, and is equal to or larger than the critical angle. Thus, the second side surface 132 can totally reflect the light generated in the optical waveguides 160, 162, and 164.

It should be noted that the sentence that "the angle of the first optical waveguide 160 with respect to the perpendicular P2 and the angle of the second optical waveguide 162 with respect to the perpendicular P2 are the same" means that the difference between the both angles is within a range of about ±2° taking the production tolerance in, for example, etching into consideration.

The second optical waveguide 162 is connected to the third side surface 133 and is tilted at an angle γ with the perpendicular P3 of the third side surface 133 in the plan view. In other words, it can be said that the extending direction of the second optical waveguide 162 has an angle γ with the perpendicular P3.

The length of the second optical waveguide 162 in the extending direction is longer than the length of the first optical waveguide 160 in the extending direction and the length of the third optical waveguide 164 in the extending direction. The length of the second optical waveguide 162 in the extending direction can also be equal to or longer than sum of the length of the first optical waveguide 160 in the extending direction and the length of the third optical waveguide 164 in the extending direction. It should be noted that "the length of the second optical waveguide 162 in the extending direction" can also be said to be the distance between the center of the third end surface 183 and the center of the fourth end surface 184. It can also be said that the length in the extending direction is the distance between the centers of the two end surfaces, which can also apply to the other optical waveguides in a similar manner.

The third optical waveguide 164 extends from the third side surface 133 to the first side surface 131 in the plan view. In the plan view, the third optical waveguide 164 has, for example, a predetermined width, and is provided with a belt-like linear longitudinal shape along the extending direction of the third optical waveguide 164. The third optical waveguide 164 has a fifth end surface 185 provided on the third side surface 133 and a sixth end surface 186 provided on the first side surface 131.

It should be noted that the extending direction of the third optical waveguide 164 denotes, for example, the extending direction of a straight line passing through the center of the fifth end surface 185 and the center of the sixth end surface 186 in the plane view. Further, it can also be the extending direction of a boundary line of the third optical waveguide 164 (with the portion except the third optical waveguide 164).

The fifth end surface 185 of the third optical waveguide 164 overlaps with the fourth end surface 184 of the second optical waveguide 162 on the third side surface 133. In the example shown in the drawing, the fourth end surface 184 and the fifth end surface 185 completely overlap with each other in an overlapping plane 192.

The first optical waveguide 160 and the third optical waveguide 164 are set apart from each other. In the example shown in FIG. 1, the first end surface 181 of the first optical waveguide 160 and the sixth end surface 186 of the third optical waveguide 164 are set apart from each other at a distance D.

The third optical waveguide 164 is connected to the third side surface 133 and is tilted at an angle $\gamma$ with the perpendicular P3 of the third side surface 133 in the plan view. In other words, it can be said that the extending direction of the third optical waveguide 164 has an angle $\gamma$ with the perpendicular P3. That is, the angle of the second optical waveguide 162 with respect to the perpendicular P3 and the angle of the third optical waveguide 164 with respect to the perpendicular P3 are the same within the range of the production tolerance. The angle $\gamma$ is, for example, an acute angle, and is equal to or larger than the critical angle. Thus, the third side surface 133 can totally reflect the light generated in the optical waveguides 160, 162, and 164.

It should be noted that the sentence that "the angle of the second optical waveguide 162 with respect to the perpendicular P3 and the angle of the third optical waveguide 164 with respect to the perpendicular P3 are the same" means that the difference between the both angles is within a range of about ±2° taking the production tolerance in, for example, etching into consideration.

The third optical waveguide 164 is connected to the first side surface 131 and is tilted at an angle $\alpha$ with the perpendicular P1 in the plan view. In other words, it can be said that the longitudinal direction of the third optical waveguide 164 has an angle $\alpha$ with the perpendicular P1. That is, the first optical waveguide 160 and the third optical waveguide 164 are connected to the first side surface 131 in the same direction, and are parallel to each other. More specifically, the extending direction of the first optical waveguide 160 and the extending direction of the third optical waveguide 164 are parallel to each other. Thus, the light 20 emitted from the first end surface 181 and the light 22 emitted from the sixth end surface 186 can proceed in the same direction. It should be noted that the third optical waveguide 164 can also be parallel ($\alpha=0°$) to the perpendicular P1 of the first side surface 131.

As described above, by setting the angles $\beta$, $\gamma$ to be equal to or larger than the critical angle and the angle $\alpha$ to be smaller than the critical angle, the reflectance of the first side surface 131 can be made lower than the reflectance of the second side surface 132 and the reflectance of the third side surface 133. Thus, it is possible for the first end surface 181 provided on the first side surface 131 to be a light emitting section (a first light emitting section 181) that emits the light generated in the optical waveguides 160, 162, and 164. It is also possible for the sixth end surface 186 provided on the first side surface 131 to be a light emitting section (a second light emitting section 186) that emits the light generated in the optical waveguides 160, 162, and 164. It is possible for the overlapping plane 190 of the end surfaces 182, 183 provided on the second side surface 132 to be a light reflecting section (a first light reflecting section 190) that reflects the light generated in the optical waveguides 160, 162, and 164. It is also possible for the overlapping plane 192 of the end surfaces 184, 185 provided on the third side surface 133 to be a light reflecting section (a second light reflecting section 192) that reflects the light generated in the optical waveguides 160, 162, and 164.

In other words, the first optical waveguide 160 extends from the first light emitting section 181 to the first light reflecting section 190. The second optical waveguide 162 extends from the first light reflecting section 190 to the second light reflecting section 192. The third optical waveguide 164 extends from the second light reflecting section 192 to the second light emitting section 186.

In the example shown in the drawing, the surfaces of the light emitting sections 181, 186 and the light reflecting sections 190, 192 are exposed. However, it is also possible, for example, to cover the first side surface 131 (the light emitting sections 181, 186) with an antireflection coating, and to cover the second side surface 132 and the third side surface 133 (the light reflecting sections 190, 192) with a high reflection coating. Thus, even when incident angles, the refractive indices, may not satisfy the total reflection condition, it is possible to make the reflectance of the first side surface 131 in the wavelength band of the light generated in the optical waveguides 160, 162, and 164 lower than that of the second side surface 132 and the third side surface 133. Further, by covering the first side surface 131 with the antireflection coating, it is possible to prevent or suppress direct multiple reflections of the light generated in the optical waveguides 160, 162, and 164 between the first end surface 181 and the sixth end surface 186. As a result, since it is possible to prevent formation of a direct resonator, laser oscillation of the light generated in the optical waveguides 160, 162, and 164 can be prevented or suppressed.

As the high reflection coating and the antireflection coating, for example, an $SiO_2$ layer, a $Ta_2O_5$ layer, an $Al_2O_3$ layer, a TiN layer, a $TiO_2$ layer, an SiON layer, an SiN layer, a multilayer film of these layers, or the like can be used. Further, it is also possible to form a distributed Bragg reflector (DBR) on each of the side surfaces 132, 133 by etching to thereby obtain a high reflectance.

Further, the angle α can be an angle larger than 0°. Thus, it is possible to prevent direct multiple reflections of the light generated in the optical waveguides 160, 162, and 164 the first end surface 181 and the sixth end surface 186. As a result, since it is possible to prevent formation of a direct resonator, laser oscillation of the light generated in the optical waveguides 160, 162, and 164 can be suppressed or prevented.

As shown in FIGS. 1 and 2, in each of the first light reflecting section 190 and the second light reflecting section 192, there is formed a diffusion region 170 where an element of the group II or an element of the group XII is diffused.

As the element of the group II or the element of the group XII in the diffusion region 170, zinc, magnesium, and beryllium, for example, can be cited. Such elements can get into the site of Ga or Al in the InGaAlP layer and the InGaP layer constituting, for example, the active layer 106. On this occasion, Ga or Al moved from the original sites by the element of the group II or the group XII getting thereinto can get into the site of other Ga or Al. In other words, Ga and Al can be diffused mutually in the InGaAlP layer and the InGaP layer. Thus, it is possible to widen the bandgap of the InGaP layer to an extent closer to the bandgap of the InGaAlP layer. Specifically, regarding the bandgap, the InGaP layer is a layer having the narrowest bandgap out of the layers constituting the active layer 106. Accordingly, in the active layer 106, the bandgap of the part where the diffusion region 170 is provided can be wider than that of the part where the diffusion region 170 is not provided. As a result, the reabsorption of the light in the quantum well can be suppressed in the light reflecting sections 190, 192, and thus, the catastrophic optical damage (COD) in the light reflecting sections 190, 192 can be suppressed. The COD can be caused by a positive feedback of heat generation arising from non-radiative recombination and the reabsorption in the quantum well, narrowing of the bandgap of the quantum well due to rise in temperature, and increase in the heat generation arising from the reabsorption.

As long as the diffusion region 170 is formed including the light reflecting sections 190, 192 as shown in FIG. 2, the diffusion region 170 can be provided only in the vicinity of the second side surface 132 and the third side surface 133 of the active layer 106. Further, the diffusion region 170 can also be formed on the entire area of the second side surface 132 and the third side surface 133 of the active layer 106. Further, as shown in FIG. 2, the diffusion region 170 can also be provided to the first cladding layer 104, the second cladding layer 108, and the contact layer 110.

As shown in FIGS. 1 and 2, the diffusion region 170 is formed further including the first light emitting section 181 and the second light emitting section 186. In the example shown in the drawings, the diffusion region 170 is formed in the entire area of the first side surface 131 of the active layer 106.

As shown in FIGS. 2 and 3, the second cladding layer 108 is formed on the active layer 106. As the second cladding layer 108, an InGaAlP layer of a second conductivity type (e.g., p-type), for example, can be used.

For example, a pin diode is formed by the p-type second cladding layer 108, the active layer 106 with no impurity doped, and the n-type first cladding layer 104. Each of the first cladding layer 104 and the second cladding layer 108 is a layer having a bandgap larger than that of the active layer 106 and a refractive index smaller than that of the active layer 106. The active layer 106 has a function of generating light by an injection current and guiding and amplifying the light. The first cladding layer 104 and the second cladding layer 108 sandwiching the active layer 106 have a function of confining injected carriers (electrons and holes) and the light (preventing the leakage of light).

In the light emitting device 100, when applying a forward bias voltage of the pin diode between a first electrode 112 and a second electrode 114 (when injecting an electrical current), there occurs recombination of electrons and the holes in the portions of the optical waveguides 160, 162, and 164 to which electrical current is injected. Light is generated by the recombination. Start from the generated light, stimulated emission occurs and the intensity of the light is amplified inside the portions of the optical waveguides 160, 162, and 164 to which electrical current is injected. As described above, in the present embodiment, since the whole of the optical waveguides 160, 162, and 164 is sandwiched by the electrodes 112, 114 (more specifically, the contact surfaces 113, 115), electrical current is injected into the whole of the optical waveguides 160, 162, and 164. Therefore, the light is amplified in any part of the optical waveguides 160, 162, and 164.

For example, as shown in FIG. 1, the light 10 generated in the first optical waveguide 160 and proceeding toward the second side surface 132 is amplified in the first optical waveguide 160, and is then reflected by the first light reflecting section 190, and then proceeds through the second optical waveguide 162 toward the third side surface 133. Then, the light 10 is further reflected by the second light reflecting section 192, then travels through the third optical waveguide 164, and is then emitted from the sixth end surface 186 as the outgoing light 22. On this occasion, the intensity of the light is also amplified in the optical waveguides 162, 164. Similarly, the light generated in the third optical waveguide 164 and proceeding toward the third side surface 133 is amplified in the third optical waveguide 164, and is then reflected by the second light reflecting section 192, and then proceeds through the second optical waveguide 162 toward the second side surface 132. Then, the light is further reflected by the first light reflecting section 190, then travels through the first optical waveguide 160, and is then emitted from the first end surface 181 as the outgoing light 20. On this occasion, the intensity of the light is also amplified in the optical waveguides 160, 162.

It should be noted that some of light generated in the first optical waveguide 160 is directly emitted from the first end surface 181 as the outgoing light 20. Similarly, some of light generated in the third optical waveguide 164 is directly emitted from the sixth end surface 186 as the outgoing light 22. Such light is also amplified in the respective optical waveguides 160, 164 in a similar manner.

The contact layer 110 is formed on the second cladding layer 108. The contact layer 110 is formed between the second cladding layer 108 and the second electrode 114. The contact layer 110 can have ohmic contact with the second electrode 114. It can be said that the upper surface 115 of the contact layer 110 is a contact surface 115 between the contact layer 110 and the second electrode 114. As the contact layer 110, for example, a p-type GaAs layer can be used.

The contact layer 110 and part of the second cladding layer 108 can form a columnar section 111. The planar shape of the columnar section 111 viewed from the stacking direction of the laminated body 120 is the same as the planar shape of the optical waveguides 160, 162, and 164 viewed from the stacking direction of the laminated body 120. In other words, it can be said that the planar shape of the upper surface 115 of the contact layer 110 is the same as the planar shape of the optical waveguides 160, 162, and 164. The current channel between the electrodes 112, 114 is determined in accordance with the planar shape of the columnar section 111, for example, and as a result, the planar shape of the optical waveguides 160, 162, and 164 is determined. It should be noted that although not shown in the drawings, the side surfaces of the columnar section 111 can be inclined.

The insulating layer 116 is formed on the lateral side of the columnar section 111 on the second cladding layer 108 (on the periphery of the columnar section 111 in the plan view). The insulating layer 116 can have contact with the side surfaces of the columnar section 111. The upper surfaces of the insulating layer 116 can be contiguous to, for example, the upper surface 115 of the contact layer 110. As the insulating layer 116, for example, an SiN layer, an $SiO_2$ layer, an SiON layer, an $Al_2O_3$ layer, a polyimide layer, or the like can be used. When such materials are used as the insulating layer 116, the current between the electrodes 112, 114 can flow through the columnar section 111 sandwiched between parts of the insulating layer 116 while avoiding the insulating layer 116.

The insulating layer 116 can have a refractive index lower than the refractive index of the second cladding layer 108. In this case, the effective refractive index of the vertical cross-section of the portion in which the insulating layer 116 is provided becomes lower than the effective refractive index of the vertical cross-section of the portion in which the insulating layer 116 is not provided, namely the portion in which the columnar section 111 is provided. Thus, it is possible to efficiently confine the light inside the optical waveguides 160, 162, and 164 in the planar direction. It should be noted that although not shown in the drawings, it is also possible not to provide the insulating layer 116. In this case, an air surrounding the columnar section 111 can function as the insulating layer 116.

The first electrode 112 is formed on the entire bottom surface of the substrate 102. In the contact surface 113, the first electrode 112 can have contact with the layer (the substrate 102 in the example shown in the drawings), which has ohmic contact with the first electrode 112. The first electrode 112 is electrically connected to the first cladding layer 104 via the substrate 102. The first electrode 112 is one electrode for driving the light emitting device 100. As the first electrode 112, for example, a multilayer film obtained by stacking a Cr layer, an AuGe layer, an Ni layer, and an Au layer in this order from the substrate 102 side can be used.

It should be noted that it is also possible to dispose a second contact layer (not shown) between the first cladding layer 104 and the substrate 102, expose the second contact layer using, for example, a dry etching process from the opposite side to the substrate 102, and then dispose the first electrode 112 on the second contact layer. Thus, a single-sided electrode structure can be obtained. This formation is particularly effective when the substrate 102 is an insulator or an intrinsic semiconductor.

The second electrode 114 is formed so as to have contact with the upper surface 115 of the contact layer 110. Further, as shown in FIG. 3, the second electrode 114 can also be formed on the insulating layer 116. The second electrode 114 is electrically connected to the second cladding layer 108 via the contact layer 110. The second electrode 114 is the other the electrode for driving the light emitting device 100. As the second electrode 114 for example, a multilayer film obtained by stacking a Cr layer, an AuZn layer, and an Au layer in this order from the contact layer 110 side can be used.

Although the case of the InGaAlP type is explained hereinabove as an example of the light emitting device 100 according to the present embodiment, any material type capable of forming the optical waveguide (gain region) can be used in the light emitting device 100. In the case of materials, semiconductor materials such as an AlGaN type, a GaN type, an InGaN type, a GaAs type, an AlGaAs type, an InGaAs type, an InGaAsP type, an InP type, a GaP type, an AlGaP type, a ZnCdSe type can be used.

Further, in the explanation presented above, the light emitting device 100 is formed by waveguides of so-called an index-guiding type in which a refractive index difference is provided between the region where the insulating layer 116 is formed and the region where the insulating layer 116 is not formed, namely the region where the columnar section 111 is formed, to thereby confine the light. Although not shown in the drawings, the light emitting device according to the present embodiment can be formed by waveguides of so-called gain-guiding type in which refractive index difference is not provided by forming the columnar section 111, and the optical waveguides (the gain regions) 160, 162, and 164 form the waveguide regions as they are. In this case, an insulating layer can be formed on the portion of the upper surface 115 of the contact layer 110 except the optical waveguides 160, 162, and 164.

The light emitting device 100 according to the present embodiment can be applied to the light source for a projector, a monitor display, an illumination device, and a measuring device, for example.

The light emitting device 100 according to the present embodiment has the following features, for example.

According to the light emitting device 100, the second optical waveguide 162 is disposed from the second side surface 132 to the third side surface 133 in parallel to the first side surface 131 provided with the light emitting sections 181, 186. Therefore, it is possible to increase the distance between the light emitting sections while preventing the total length of the optical waveguide from increasing compared to the case in which, for example, the second optical waveguide is non-parallel to the first side surface. In other words, the distance between plurality of light emitting sections (the distance between the light emitting sections 181, 186) can be increased while achieving downsizing of the device length in a direction perpendicular to the side surface provided with the light emitting sections. Thus, in the light emitting device 100, a large amount of electrical current is not required, and the electrical power consumption can be reduced. Further, waste of resources can be suppressed and manufacturing cost can be reduced. More specifically, in the light emitting device 100, it is possible to arrange that the distance D between the light emitting sections 181, 186 is not smaller than 0.262 mm and smaller than 3 mm, the angle α is not larger than 5° (including 0°) and the total length of the optical waveguides 160, 162, and 164 is not smaller than 1.5 mm and not larger than 3 mm.

For example, when the total length of the optical waveguide increases, in general, a large amount of electrical current is required to obtain the so-called population inversion although increase in output can be achieved, and as a result, increase in efficiency can not be realized unless it is used at a light output unnecessarily higher than a predetermined level. In other words, the efficiency can be degraded at a light output lower than the predetermined level. Further, the area of the entire device increases in accordance with increase in the total length of the optical waveguide, which causes a problem of waste of resources and increase in manufacturing cost. In the light emitting device 100 according to the present embodiment, such a problem can be avoided.

Further, in the light emitting device 100, an element of the group II or the group XII is diffused in the light reflecting sections 190, 192. Thus, in the active layer 106, it is possible to make the bandgap of the light reflecting sections 190, 192 wider than that of the portion where the diffusion region 170 is not disposed. More specifically, by diffusing the element of the group II or the group XII in the light reflecting sections 190, 192, Ga and Al are diffused mutually in the active layer 106, which makes it possible to widen the bandgap of the quantum well layer having the narrowest bandgap out of the layers constituting the active layer 106. As a result, the reabsorption of the light in the quantum well can be suppressed in the light reflecting sections 190, 192, and thus, the COD in the light reflecting sections 190, 192 can be suppressed. Here, in general, so-called dangling bonds in which the atoms constituting the crystal are unable to be bonded by supplying electrons to each other are formed in the side surface of the active layer forming the light reflecting section and so on. When an electrical current is injected to such a part, surface recombination of electrons and holes occurs, and then heat generation arises from non-radiative recombination caused by the surface recombination. When the heat generation arises, the bandgap narrows due to rise in temperature and the reabsorption of the light in the quantum well increases. When the reabsorption of the light increases, the heat generation due to the non-radiative recombination further increases. The heat generation and the reabsorption of the light are repeated in such a manner as described above, and the side surface is finally broken to cause the COD. In the light emitting device 100 according to the present embodiment, as described above, the light reflecting sections 190, 192 with the element of the group II or the group XII diffused can have a wide bandgap to thereby suppress the reabsorption of the light. As a result, the COD in the light reflecting sections 190, 192 can be suppressed. It should be noted that in the light emitting device 100, an element of the group II or the group XII can also be diffused in the light emitting sections 181, 186. Therefore, the COD in the light emitting sections 181, 186 can also be suppressed. According to the light emitting device 100, the first optical waveguide 160 and the second optical waveguide 162 can be connected to the first light reflecting section 190 with a tilt angle β with the perpendicular P2 of the second side surface 132, and the second optical waveguide 162 and the third optical waveguide 164 can be connected to the second light reflecting section 192 with a tilt angle γ with the perpendicular P3 of the third side surface 133. The angles β, γ can be equal to or larger than the critical angle. Therefore, the light reflecting sections 190, 192 can totally reflect the light generated in the optical waveguides 160, 162, and 164. Therefore, in the light emitting device 100, the light loss in the light reflecting sections 190, 192 can be suppressed to thereby efficiently reflect the light. Further, since the process of covering the light reflecting sections 190, 192 with high reflection coating is not necessary, the manufacturing cost and materials and resources necessary for the manufacture can be reduced.

According to the light emitting device 100, it is possible to make the length of the second optical waveguide 162 longer than that of the first optical waveguide 160 and the third optical waveguide 164. Thus, the distance D between the light emitting sections 181, 186 can surely be increased.

According to the light emitting device 100, each of the second side surface 132 and the third side surface 133 can be an etched surface formed by etching. Generally, the dangling bonds are more easily formed in the etched surface compared to the cleavage surface formed by cleavage. In the light emitting device 100, since the element of the group II or the group XII is diffused in the light reflecting sections 190, 192, even in the light reflecting sections 190, 192 provided to the etched surfaces, the COD can be suppressed.

According to the light emitting device 100, the element of the group II or the group XII in the diffusion region 170 can be zinc. Since zinc can easily be diffused and get into the group III element sites (e.g., Al sites) of the active layer 106, it is preferably used as the element constituting the diffusion region 170.

2. Method of Manufacturing Light Emitting Device

Then, a method of manufacturing the light emitting device according to the present embodiment will be explained with reference to the accompanying drawings. FIGS. 4 through 9 are cross-sectional views schematically showing the manufacturing process of the light emitting device 100 according to the present embodiment, and each correspond to FIG. 2.

Figure 4:
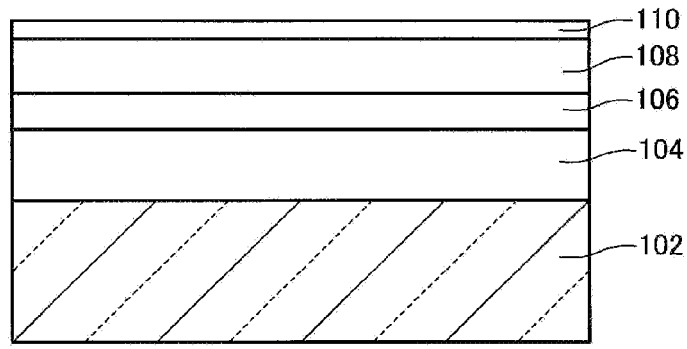
FIG. 4 is a cross-sectional view schematically showing a manufacturing process of the light emitting device according to the embodiment.

As shown in FIG. 4, the first cladding layer 104, the active layer 106, the second cladding layer 108, and the contact layer 110 are epitaxially grown on the substrate 102 in this order. As the method of growing the layers epitaxially, there can be used, for example, a metal organic chemical vapor deposition (MOCVD) method, and a molecular beam epitaxy (MBE) method.

Figure 5:
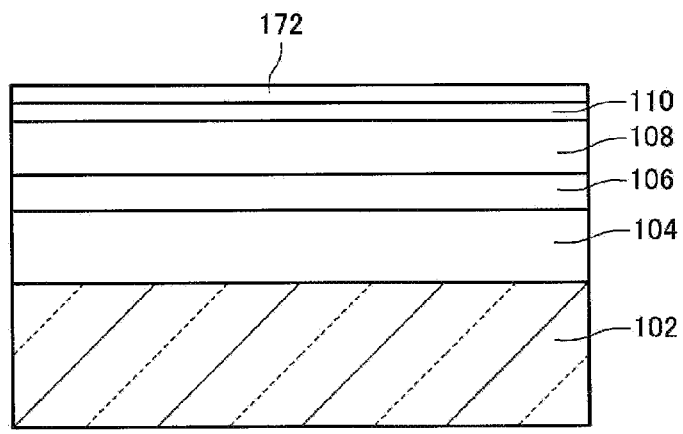
FIG. 5 is a cross-sectional view schematically showing the manufacturing process of the light emitting device according to the embodiment.

As shown in FIG. 5, a diffusion source layer 172 is formed on the contact layer 110. The diffusion source layer 172 is formed using, for example, a sputtering method and a vacuum deposition method. As the material of the diffusion source layer 172, there can be cited, for example, zinc, magnesium, beryllium, and oxides of these materials.

Figure 6:
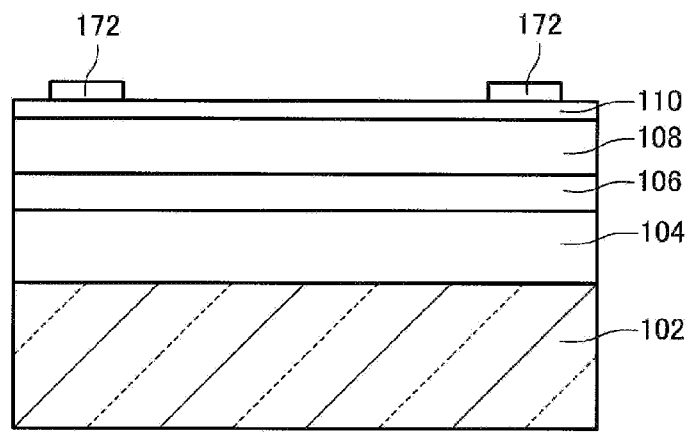
FIG. 6 is a cross-sectional view schematically showing the manufacturing process of the light emitting device according to the embodiment.

As shown in FIG. 6, the diffusion source layer 172 is patterned to be a predetermined shape. The patterning is performed using, for example, a photolithography process and an etching process. The etching is performed by, for example, a dry etching using a $CHF_3$ gas or a $CF_4$ gas, or a wet etching using a BHF.

Figure 7:
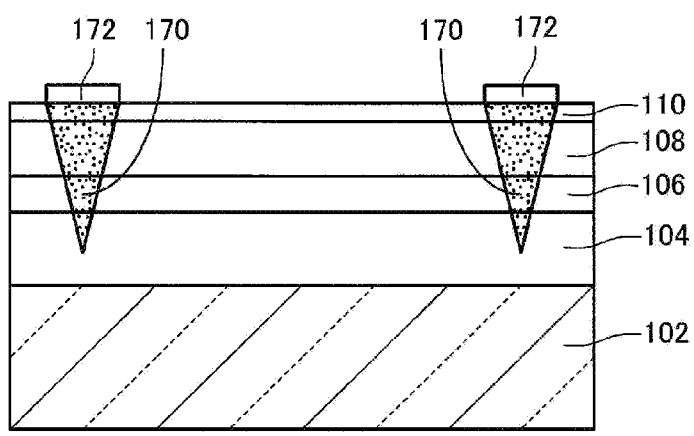
FIG. 7 is a cross-sectional view schematically showing the manufacturing process of the light emitting device according to the embodiment.

As shown in FIG. 7, a heat treatment is performed to diffuse the element of II group or XII group from the diffusion source layer 172, and thereby the diffusion regions 170 are formed. The heat treatment is performed so that the diffusion regions 170 reach at least part of the first cladding layer 104. More specifically, the heat treatment is performed, for example, at 600° C. for about 30 minutes.

Figure 8:
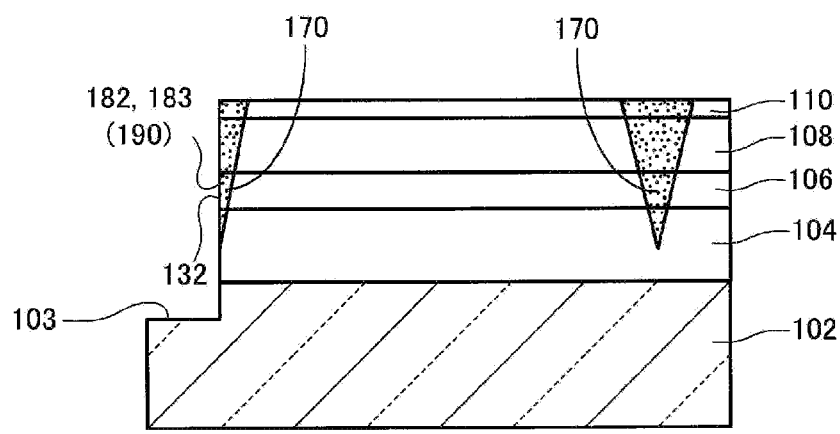
FIG. 8 is a cross-sectional view schematically showing the manufacturing process of the light emitting device according to the embodiment.

As shown in FIG. 8, the diffusion source layer 172 is removed. Then, the second side surface 132 to be provided with the first light reflecting section 190 is exposed using, for example, an etching process. It is also possible to expose the third side surface 133 (see FIG. 1) to be provided with the second light reflecting section 192 by the etching process. It should be noted that although in the example shown in the drawings the step surface 103 is provided to the substrate 102 by stopping the etching when part of the substrate 102 has been etched, the etching can also be stopped on the surface of the substrate 102, or in the middle of the first cladding layer 104.

Figure 9:
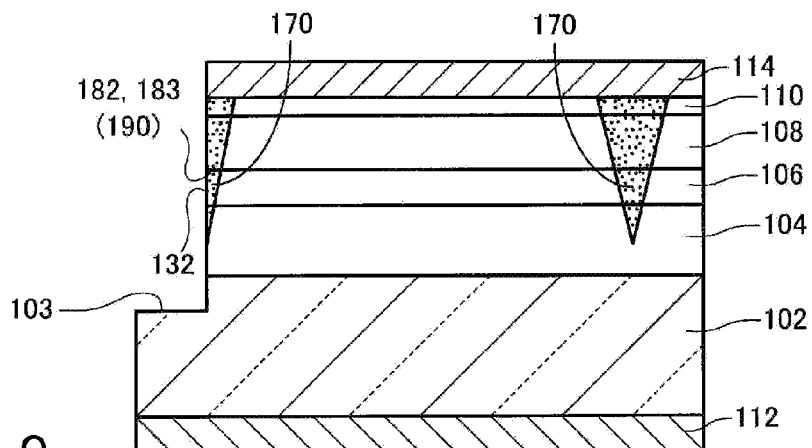
FIG. 9 is a cross-sectional view schematically showing the manufacturing process of the light emitting device according to the embodiment.

As shown in FIG. 9, the second electrode 114 is formed on the contact layer 110. Subsequently, the first electrode 112 is formed under the lower surface of the substrate 102. The first electrode 112 and the second electrode 114 are formed using, for example, a vacuum deposition method. It should be noted that the order of forming the first electrode 112 and the second electrode 114 is not particularly limited.

As shown in FIG. 2, the first side surface 131 to be provided with the light emitting sections 181, 186 is exposed by, for example, cleavage.

The light emitting device 100 according to the present embodiment can be manufactured by the processes described hereinabove.

It should be noted that, for example, prior to the process of forming the electrodes 112, 114, there can be included a processes of forming the insulating layer 116 on the contact layer 110. The insulating layer 116 can be formed by deposition process using a chemical vapor deposition (CVD) method, a coating method, or the like, and an etching process to expose the upper surface 115 of the contact layer 110. Further, a process of forming the columnar section 111 can also be included. The columnar section 111 can be formed by etching the contact layer 110 and the second cladding layer 108. The insulating layer 116 can also be formed on the lateral side of the columnar section 111 as shown in FIG. 3.

According to the manufacturing method of the light emitting device 100, there can be obtained the light emitting device 100 in which the distance D of the light emitting sections 181, 186 can be increased while achieving downsizing.

Figure 10:
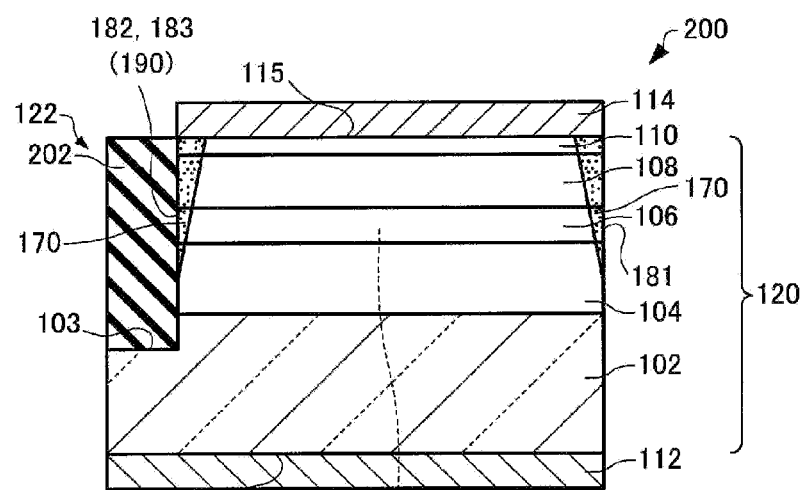
FIG. 10 is a cross-sectional view schematically showing a light emitting device according to a first modified example of the embodiment.

3. Modified Examples of Light Emitting Device 3.1. Light Emitting Device According to First Modified Example Then, a light emitting device according to a first modified example of the present embodiment will be explained with reference to the accompanying drawings. FIG. 10 is a cross-sectional view schematically showing the light emitting device 200 according to the first modified example of the present embodiment, and corresponds to FIG. 2.

Hereinafter, in the light emitting device 200 according to the first modified example of the present embodiment, the constituents thereof having the same functions as those of the light emitting device 100 according to the present embodiment will be denoted by the same reference symbols, and detailed explanation thereof will be omitted.

In the example of the light emitting device 100, the surfaces of the light reflecting sections 190, 192 are exposed as shown in FIG. 2. In contrast thereto, in the light emitting device 200, the surfaces of the light reflecting sections 190, 192 are covered by a dielectric layer 202 as shown in FIG. 10.

In the example shown in the drawing, the dielectric layer 202 is formed on the step surface 103 of the substrate 102 and on the lateral side of the first cladding layer 104, the active layer 106, the second cladding layer 108, and the contact layer 110. The upper surface of the dielectric layer 202 is contiguous to, for example, the upper surface 115 of the contact layer 110. The dielectric layer 202 is disposed so as to fill a concave section 122 of the laminated body 120 formed by, for example, the etching process for exposing the light reflecting sections 190, 192 (the side surfaces 132, 133).

As the dielectric layer 202, more specifically, there can be cited an SiN layer, an SiON layer, an SiO$_2$ layer, a Ta$_2$O$_5$ layer, an Al$_2$O$_3$ layer, a TiN layer, a TiO$_2$ layer, a multilayer film of these layers, or the like. The dielectric layer 202 is formed using, for example, a CVD method.

According to the light emitting device 200, since the light reflecting sections 190, 192 are covered by the dielectric layer 202, it is possible to partially terminate the dangling bonds of the reflecting sections 190, 192. Thus, the COD level can be increased.

Further, according to the light emitting device 200, by filling the concave section 122 with the dielectric layer 202, it is possible to easily perform junction-down mounting (mounting method for connecting the second electrode 114 side to the mounting board) preventing a conductive joint member such as solder from having contact with the light reflecting sections 190, 192 to short the p-n junction.

3.2. Light Emitting Device According to Second Modified Example

Figure 11:
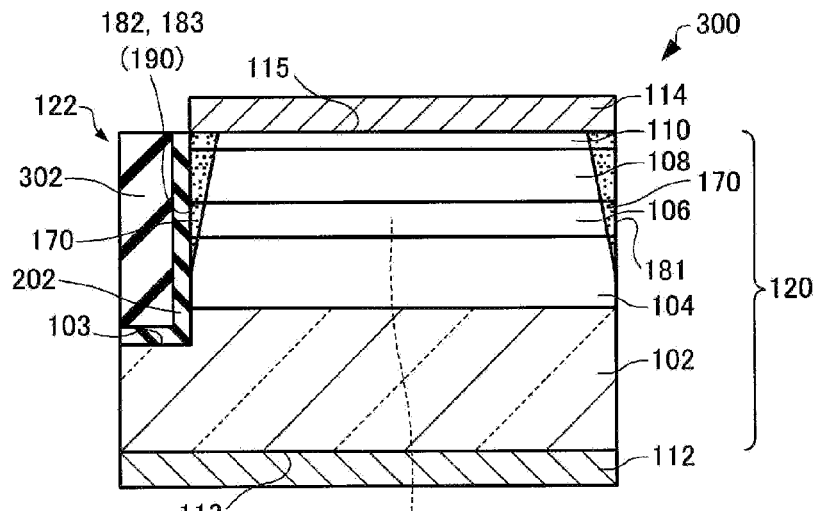
FIG. 11 is a cross-sectional view schematically showing a light emitting device according to a second modified example of the embodiment.

Then, a light emitting device according to a second modified example of the present embodiment will be explained with reference to the accompanying drawings. FIG. 11 is a cross-sectional view schematically showing the light emitting device 300 according to the second modified example of the present embodiment, and corresponds to FIG. 10.

Hereinafter, in the light emitting device 300 according to the second modified example of the present embodiment, the constituents thereof having the same functions as those of the constituents of the light emitting device 200 according to the first modified example of the present embodiment will be denoted by the same reference symbols, and detailed explanation thereof will be omitted.

In the example of the light emitting device 200, the concave section 122 of the laminated body 120 is filled with the dielectric layer 202 as shown in FIG. 10. In contrast thereto, in the light emitting device 300, the concave section 122 is filled with the dielectric layer 202 and a resin layer 302.

In the example shown in the drawing, the resin layer 302 is formed on the lateral side (in other words, on the opposite side of the dielectric layer 202 to the light reflecting sections 190, 192) of the dielectric layer 202, and the dielectric layer 202 is formed between the resin layer 302 and the first cladding layer 104, the active layer 106, the second cladding layer 108, and the contact layer 110. The upper surface of the resin layer 302 is contiguous to, for example, the upper surface of the dielectric layer 202 and the upper surface 115 of the contact layer 110.

As the resin layer 302, there can be cited, for example, a polyimide layer, an epoxy layer, or the like. The resin layer 302 is formed using, for example, a coating method. It should be noted that, for example, other materials such as a spin on grass (SOG) can also be employed instead of the dielectric layer 202 and the resin layer 302.

According to the light emitting device 300, the concave section 122 can easily be filled compared to the case in which the concave section 122 is filled with the dielectric layer 202 alone, as in the case of, for example, the light emitting device 200. In other words, for example, since the resin layer 302 is formed by the coating method, the concave section 122 can be filled in a short time compared to the dielectric layer 202 formed by the CVD method. Therefore, according to the light emitting device 300, it is possible to fill the concave section 122 with the resin layer 302 in a short time while partially terminating the dangling bonds of the light reflecting sections 190, 192 with the dielectric layer 202.

3.3. Light Emitting Device According to Third Modified Example

Figure 12:
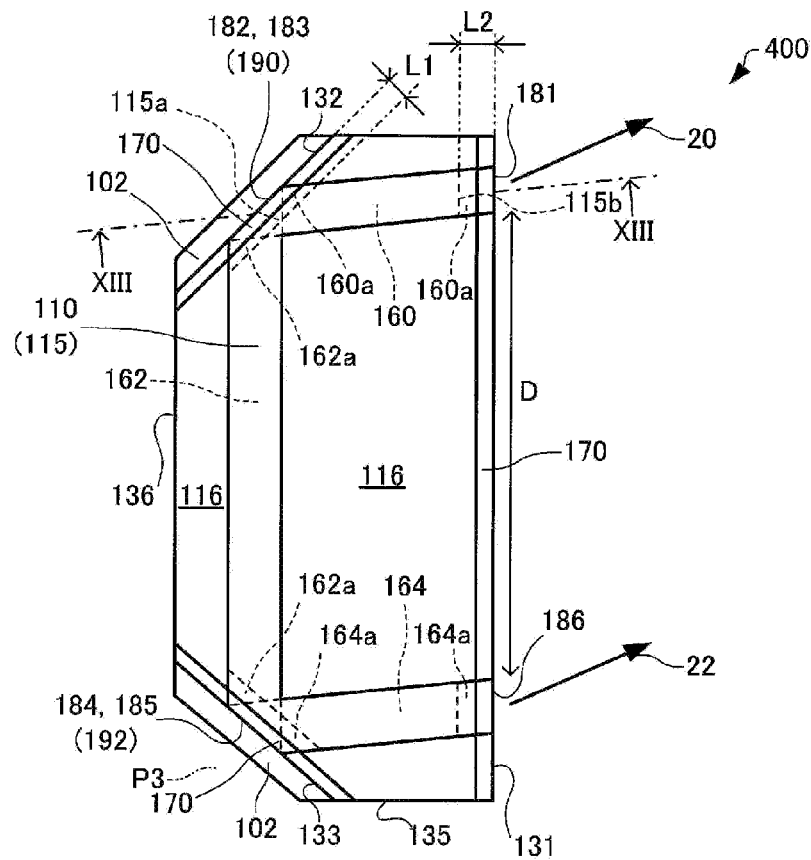
FIG. 12 is a plan view schematically showing a light emitting device according to a third modified example of the embodiment.
Figure 13:
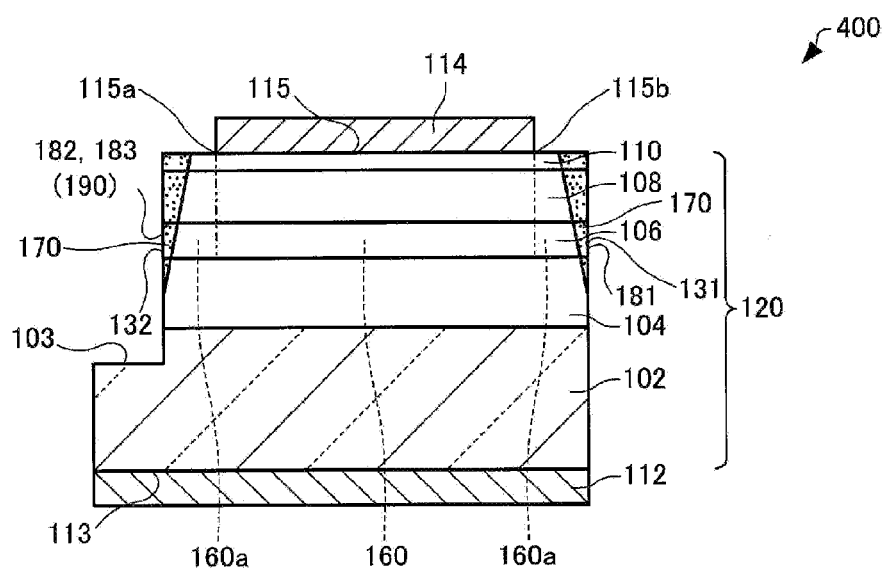
FIG. 13 is a cross-sectional view schematically showing the light emitting device according to the third modified example of the embodiment.

Then, a light emitting device according to a third modified example of the present embodiment will be explained with reference to the accompanying drawings. FIG. 12 is a plan view schematically showing the light emitting device 400 according to the third modified example of the present embodiment. FIG. 13 is a cross-sectional view along the line XIII-XIII shown in FIG. 12, schematically showing the light emitting device 400 according to the third modified example of the present embodiment. It should be noted that in FIG. 12, a second electrode 114 is omitted from the drawing for the sake of convenience.

Hereinafter, in the light emitting device 400 according to the third modified example of the present embodiment, the constituents thereof having the same functions as those of the constituents of the light emitting device 100 according to the present embodiment will be denoted by the same reference symbols, and detailed explanation thereof will be omitted. The same will be applied to a light emitting device 500 according to a fourth modified example of the present embodiment described later.

As shown in FIGS. 1 through 3, in the light emitting device 100, the whole of the optical waveguides 160, 162, and 164 is sandwiched by the electrodes 112, 114 (more specifically, the contact surfaces 113, 115), and electrical current is injected into the whole of the optical waveguides 160, 162, and 164. Therefore, the light is amplified in any part of the optical waveguides 160, 162, and 164.

In contrast thereto, as shown in FIGS. 12 and 13, in the light emitting device 400, the second electrode 114 is not disposed above part of each of the optical waveguides 160, 162, and 164. In other words, the optical waveguides 160, 162, and 164 have non-sandwiched regions 160a, 162a, and 164a, respectively, which are not sandwiched between the contact surface 113 and the contact surface 115. In the non-sandwiched regions 160a, 162a, and 164a, electrical current is not actively injected, and therefore, the intensity of the light is not actively amplified. It should be noted that the expression "electrical current is not actively injected" includes the case in which electrical current is diffused to thereby be injected into the non-sandwiched regions 160a, 162a, and 164a. Specifically, there is a case in which electrical current injected by the electrodes 112, 114 is diffused and injected into the non-sandwiched regions 160a, 162a, and 164a even if the second electrode 114 is not disposed above the non-sandwiched regions 160a, 162a, and 164a.

In the plan view, the shortest distance L1 between the light reflecting sections 190, 192 and an end portion 115a of the contact surface 115 between the second electrode 114 and the contact layer 110 is equal to or longer than, for example, 20 μm. When the distance L1 is equal to or longer than 20 μm, even in the case in which the current is diffused in the non-sandwiched regions 160a, 162a, and 164a, the current thus diffused can be suppressed or prevented from reaching the light reflecting sections 190, 192. In other words, it can be said that the diffusion distance of electrical current can be shorter than 20 μm (details will be described later). Thus, the COD in the light reflecting sections 190, 192 can further be suppressed. Similarly, as shown in FIGS. 12 and 13, by setting the shortest distance L2 between the light emitting sections 181, 186 and the end portion 115b of the contact surface 115 to be equal to or longer than 20 μm, the COD in the light emitting sections 181, 186 can be suppressed.

It should be noted that the distances L1, L2 are the distances with which the non-sandwiched regions 160a, 162a, and 164a can function as the optical waveguide, namely can perform the waveguide of the light.

Then, an experiment of researching the diffusion distance of electrical current will be explained. It should be noted that the scope of the invention is not at all limited by the following experiment.

Figure 14:
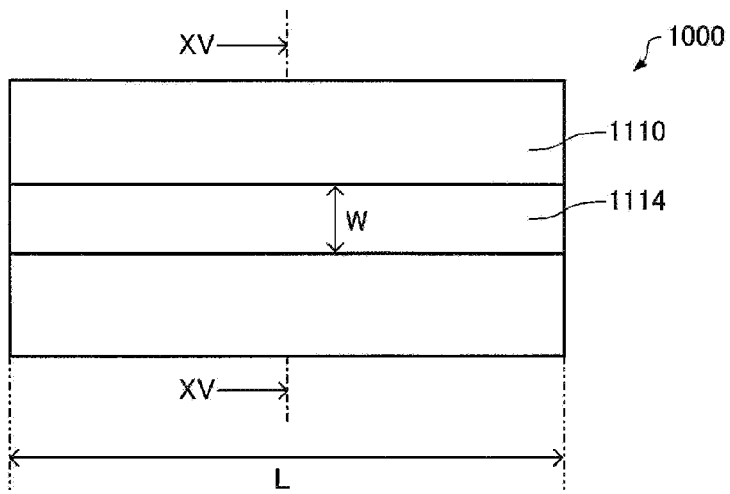
FIG. 14 is a plan view schematically showing a light emitting device according to a reference example.
Figure 15:
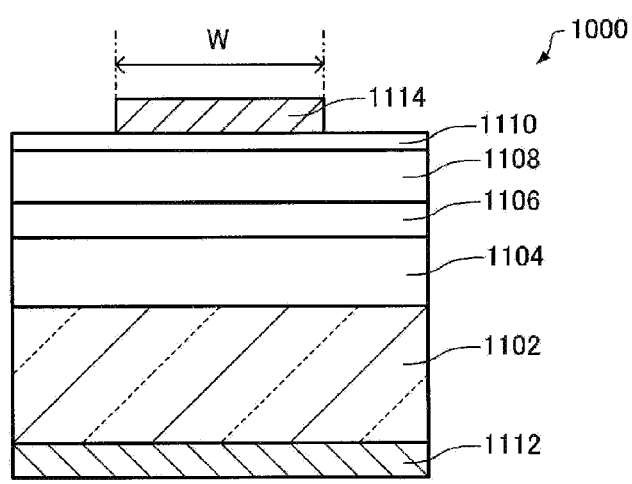
FIG. 15 is a cross-sectional view schematically showing the light emitting device according to the reference example.

FIG. 14 is a plan view schematically showing a light emitting device 1000 according to a reference example used in the experiment. FIG. 15 is a XV-XV cross-sectional view of FIG. 14, schematically showing the light emitting device 1000 according to the reference example used in the experiment.

As shown in FIGS. 14 and 15, the light emitting device 1000 can be provided with a substrate 1102, a first cladding layer 1104, an active layer 1106, a second cladding layer 1108, a contact layer 1110, a first electrode 1112, and a second electrode 1114. In the light emitting device 1000, a GaAs substrate is used as the substrate 1102. An InGaAlP layer is used as the first cladding layer 1104. An InGaP well layer and an InGaAlP barrier layer are used as the active layer 1106. An InGaAlP layer is used as the second cladding layer 1108. A GaAs layer is used as the contact layer 1110. A multilayer film obtained by stacking a Cr layer, an AuGe layer, an Ni layer, and an Au layer in this order is used as the first electrode 1112, and is formed on the entire lower surface of the substrate 1102. A multilayer film obtained by stacking a Cr layer, an AuZn layer, and an Au layer in this order from the contact layer 1110 side is used as the second electrode 1114.

In the present experiment, the semiconductor laser having the configuration described above as the light emitting device 1000, and the threshold current density of the light emitting device 1000 is measured while varying the width W (the length in the direction along the shorter side) of the second electrode 1114 to 10 μm, 20 μm, 30 μm, 40 μm, 50 μm, and 60 μm.

Figure 16:
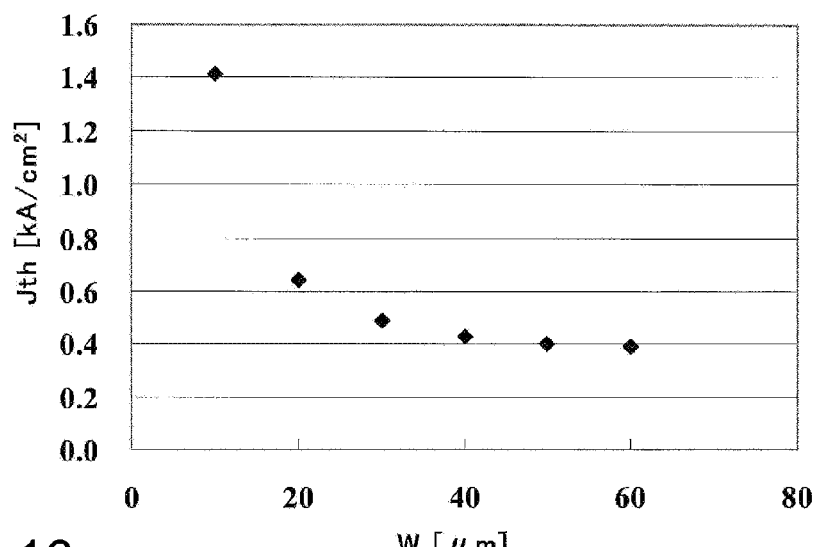
FIG. 16 is a graph showing a relationship between the width of the electrode and a current density in the light emitting device according to the reference example.

FIG. 16 is a graph showing the values (Jth) obtained by dividing the threshold current density by the width W. In FIG. 16, the length L (the length in the longitudinal direction) of the second electrode 1114 is varied to 300 μm, 400 μm, 500 μm, 700 μm, and 900 μm with respect to each of the values of the width W, and the value at which the threshold current density is saturated is plotted. In other words, it can be said that the values with which the loss in the end surface of the optical waveguide can be ignored are plotted in FIG. 16.

As shown in FIG. 16, Jth rises in the area where W is smaller than 40 μm. In other words, it can be said that when W is smaller than 40 μm, the width of the second electrode 1114 and the width of the optical waveguide are not equal to each other (the width of the optical waveguide is larger), and electrical current is diffused. In contrast, when W is equal to or larger than 40 μm, Jth is roughly constant. Therefore, it has been found out that electrical current is diffused in a range smaller than 20 μm on each side in the width W direction of the second electrode 1114. Therefore, it has been found out that, if the distance L1 is set to be equal to or longer than 20 μm as described above, the current diffused in the non-sandwiched regions 160a, 162a, and 164a can be prevented from reaching the light reflecting sections 190, 192.

3.4. Light Emitting Device According to Fourth Modified Example

Figure 17:
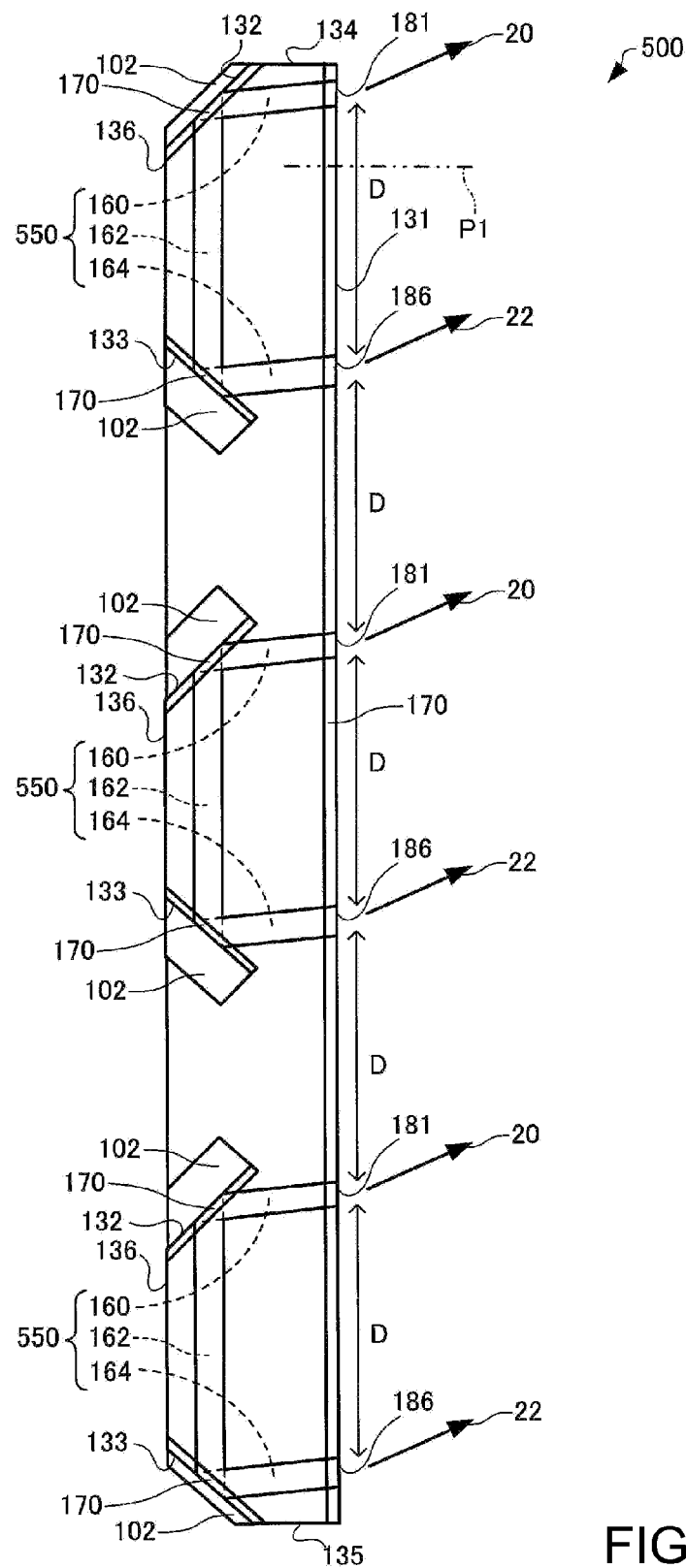
FIG. 17 is a plan view schematically showing a light emitting device according to a fourth modified example of the embodiment.

Then, a light emitting device according to a fourth modified example of the present embodiment will be explained with reference to the accompanying drawings. FIG. 17 is a plan view schematically showing the light emitting device 500 according to the fourth modified example of the present embodiment. It should be noted that in FIG. 17, a second electrode 114 is omitted from the drawing for the sake of convenience.

As shown in FIG. 1, in the example of the light emitting device 100, the single first optical waveguide 160, the single second optical waveguide 162, and the single third optical waveguide 164 are provided. In contrast thereto, as shown in FIG. 17, in the light emitting device 500, a plurality of first optical waveguides 160, a plurality of second optical waveguides 162, and a plurality of third optical waveguides 164 are provided. Specifically, the first optical waveguide 160, the second optical waveguide 162, and the third optical waveguide 164 can constitute an optical waveguide group 550, and the light emitting device 500 is provided with a plurality of optical waveguide groups 550. Although the three optical waveguide groups 550 are provided in the example shown in the drawing, the number thereof is not particularly limited.

The plurality of optical waveguide groups 550 is arranged along a direction perpendicular to the direction in which the perpendicular P1 of the first side surface 131 extends. More specifically, it is arranged so that in the optical waveguide groups 550 adjacent to each other, the distance between the sixth end surface 186 of one optical waveguide group 550 and the first end surface 181 of the other optical waveguide group 550 is D (equal to the distance between the light emitting sections). Thus, it is possible to easily make the light 20, 22 enter the lens array described later.

According to the light emitting device 500, a higher output can be achieved compared to the example of the light emitting device 100.

4. Projector

Figure 18:
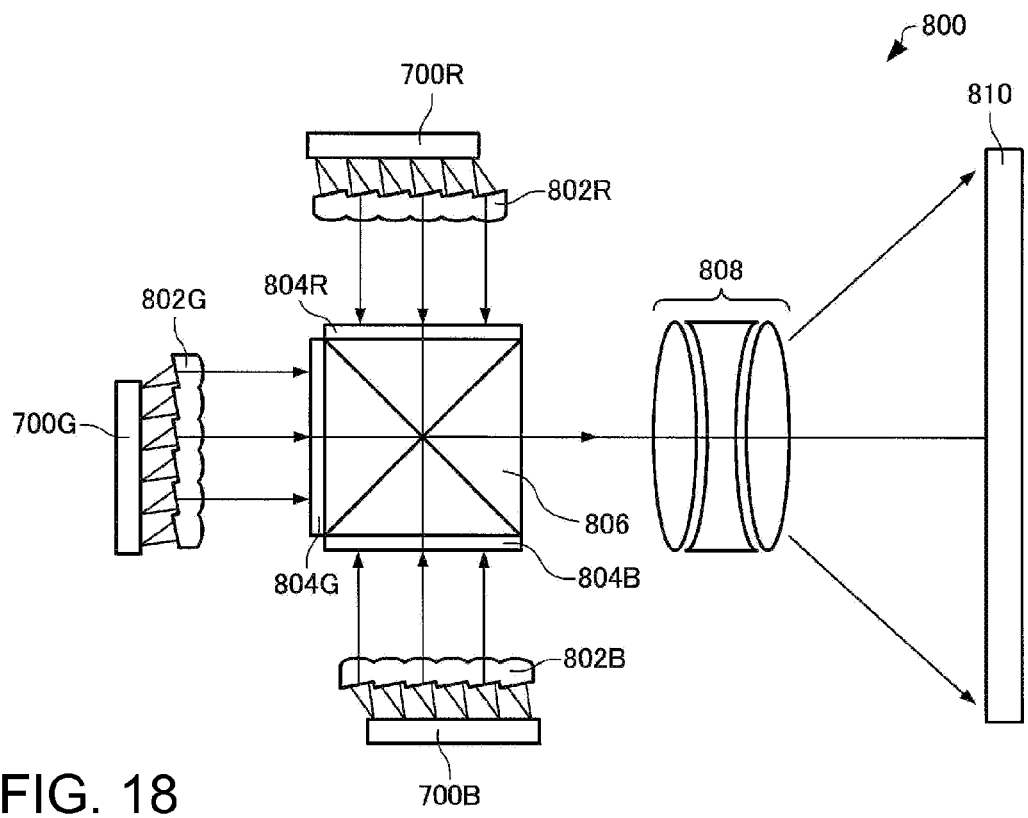
FIG. 18 is a diagram schematically showing a projector according to an embodiment of the invention.
Figure 19:
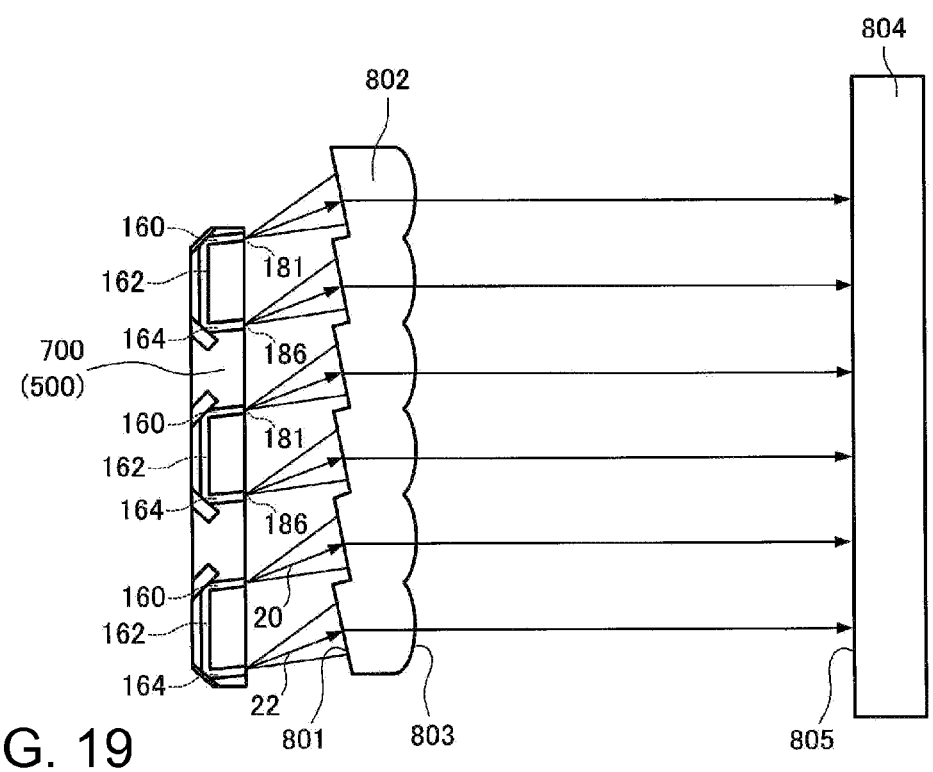
FIG. 19 is a diagram schematically showing the projector according to the embodiment.

Then, a projector according to the present embodiment will be explained with reference to the accompanying drawings. FIG. 18 is a diagram schematically showing the projector 800 according to the present embodiment. FIG. 19 is a diagram schematically showing part of the projector 800 according to the present embodiment. It should be noted that in FIG. 18, a housing constituting the projector 800 is omitted, and further, light sources 700 are shown schematically for the sake of convenience. Further, in FIG. 19, the light source 700, a lens array 802, and a liquid crystal light valve 804 are shown, and the light source 700 is shown schematically for the sake of convenience. As shown in FIG. 18, the projector 800 includes a red light source 700R, a green light source 700G, a blue light source 700B for respectively emitting red light, green light, and blue light. The light sources 700R, 700G, and 700B each have the light emitting device according to the embodiment of the invention. In the example described below, the light sources 700R, 700G, and 700B each having the light emitting device 500 as the light emitting device according to the embodiment of the invention will be explained.

Figure 20:
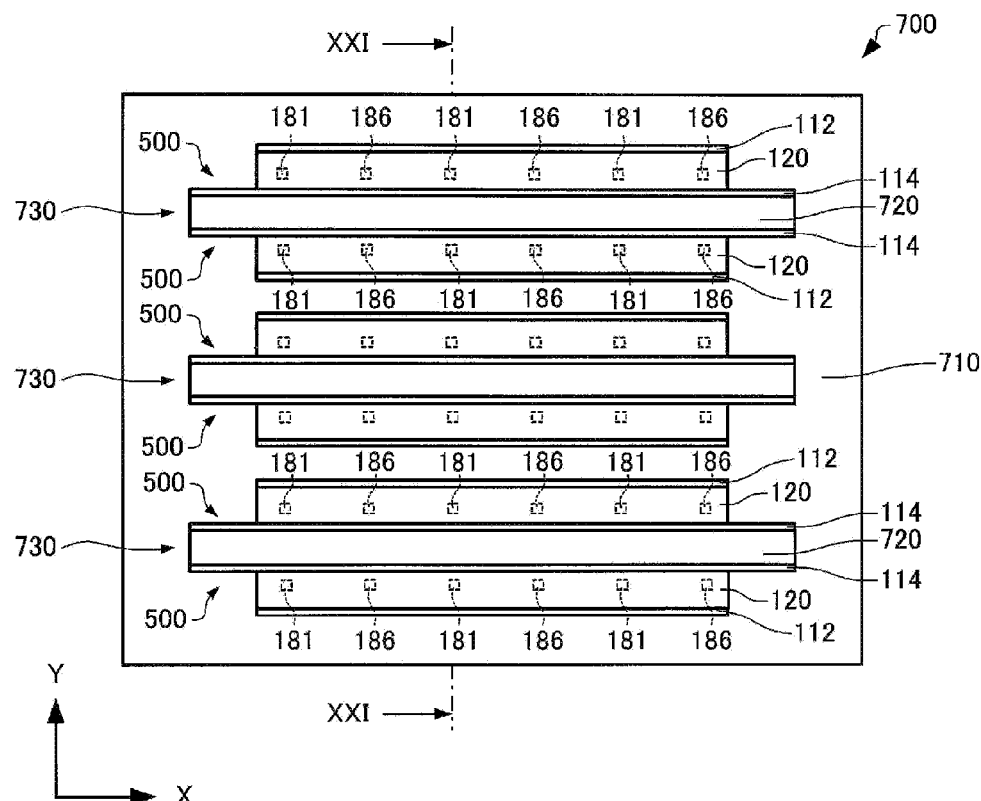
FIG. 20 is a diagram schematically showing a light source of the projector according to the embodiment.
Figure 21:
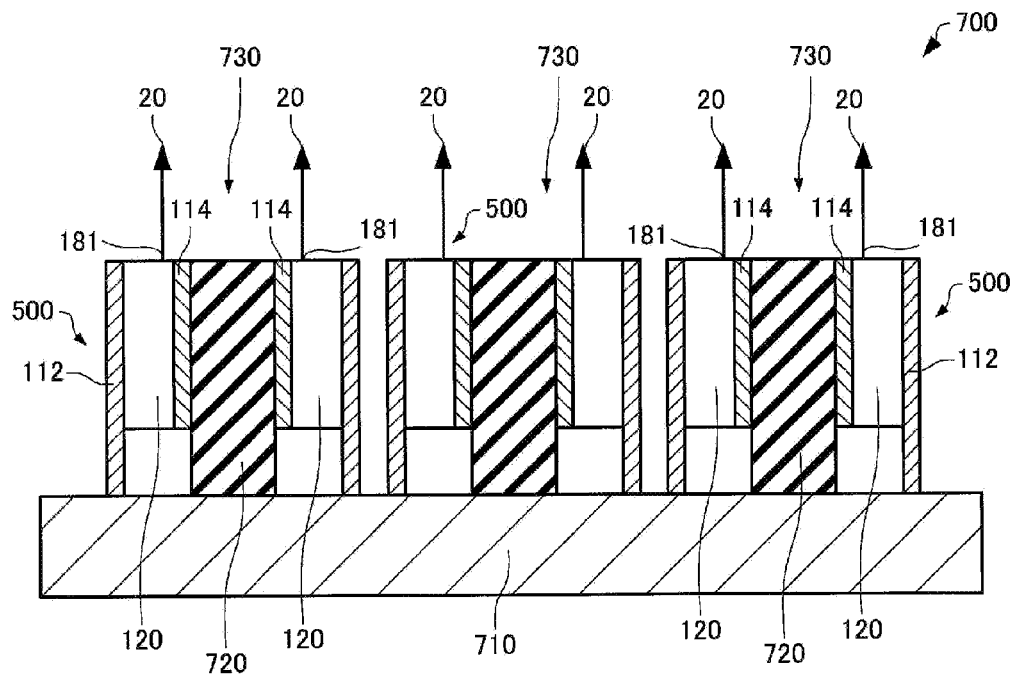
FIG. 21 is a cross-sectional view schematically showing the light source of the projector according to the embodiment.

FIG. 20 is a diagram schematically showing the light source 700 of the projector 800 according to the present embodiment. FIG. 21 is a cross-sectional view along the line XXI-XXI in FIG. 20, schematically showing the light source 700 of the projector 800 according to the present embodiment.

As shown in FIGS. 20 and 21, the light source 700 can be provided with the light emitting devices 500, a base 710, and sub-mounts 720.

The two light emitting devices 500 and the sub-mount 720 can constitute a structure 730. As shown in FIG. 20, the plurality of structures 730 is provided and arranged in a direction (the Y-axis direction) perpendicular to the arrangement direction (the X-axis direction) of the end surfaces 181, 186 forming the light emitting sections of the light emitting device 500. The structures 730 can be arranged so that the distance between the light emitting sections in the X-axis direction and the distance between the light emitting sections in the Y-axis direction are equal to each other. Thus, it is possible to easily make the light emitted from each of the light emitting devices 500 enter the lens array 802.

The two light emitting devices 500 constituting the structure 730 are arranged on both sides of the sub-mount 720. In the example shown in FIGS. 20 and 21, the two light emitting devices 500 are arranged so that the second electrodes 114 are opposed to each other via the sub-mount 720. On the surface of the sub-mount 720 having contact with the second electrodes 114, there is formed, for example, a wiring pattern. Thus, it is possible to individually supply each of the plurality of second electrodes 114 with a voltage. As the material of the sub-mount 720, there can be cited, for example, aluminum nitride and aluminum oxide.

The base 710 supports the structures 730. In the example shown in FIG. 21, the base 710 is connected to the first electrodes 112 of the plurality of light emitting devices 500. Thus, the base 710 can function as a common electrode of the plurality of first electrodes 112. As the material of the base 710, there can be cited, for example, copper and aluminum. Although not shown in the drawings, the base 710 can also be connected to a heat sink via a Peltier element.

Figure 22:
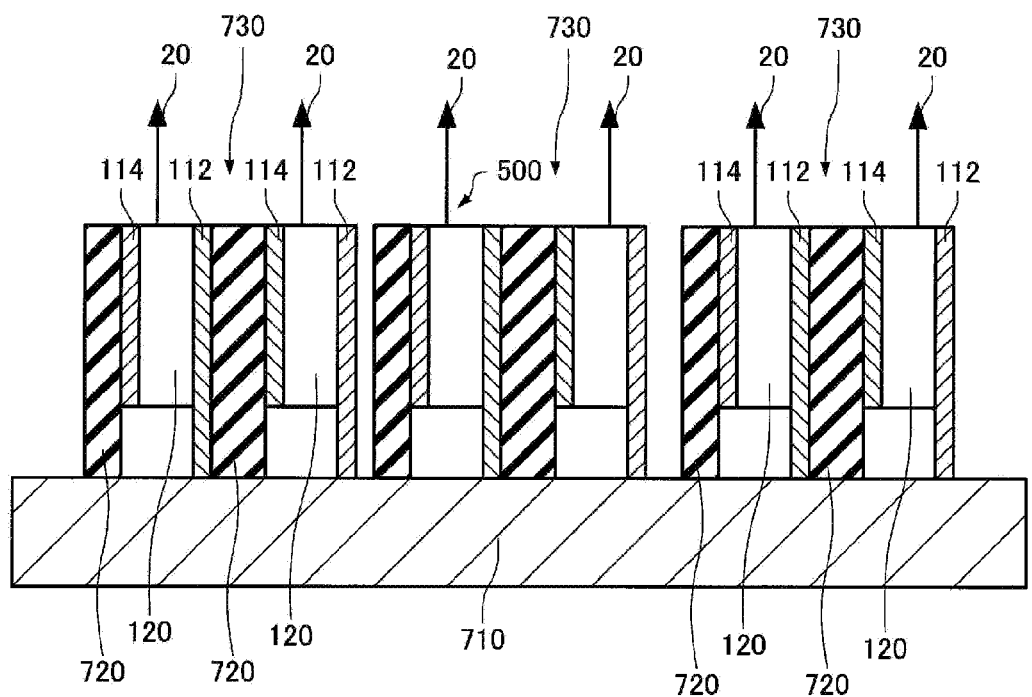
FIG. 22 is a cross-sectional view schematically showing the light source of the projector according to the embodiment.
Figure 23:
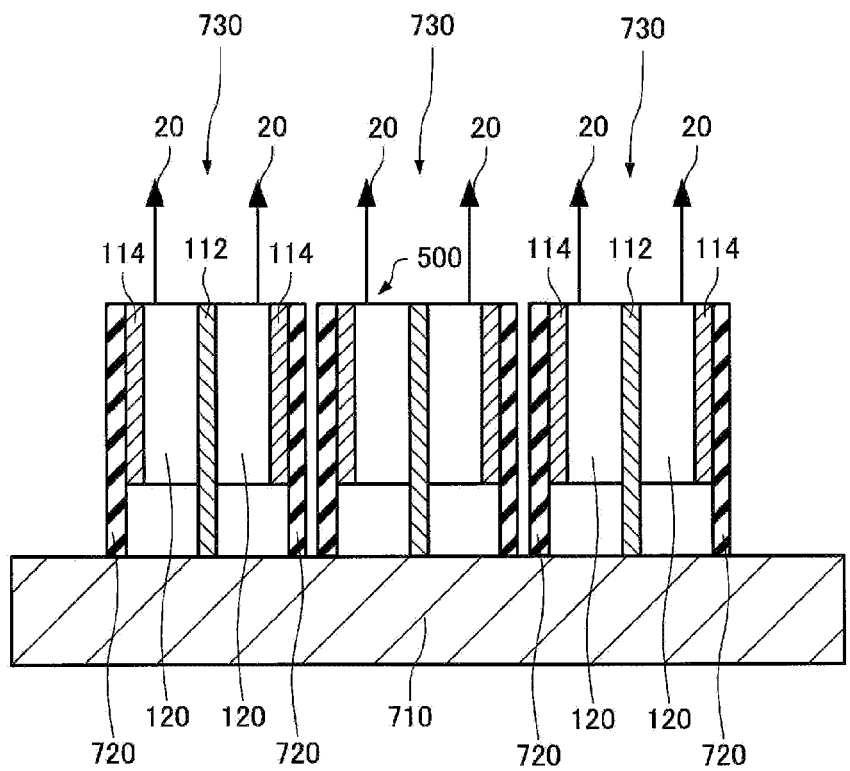
FIG. 23 is a cross-sectional view schematically showing the light source of the projector according to the embodiment.

It should be noted that the form of the structure 730 is not limited to the example shown in FIGS. 20, 21. For example, the two light emitting devices 500 constituting the structure 730 can also be disposed so that the first electrode 112 of one of the light emitting devices 500 and the second electrode 114 of the other of the light emitting devices 500 are opposed to each other via the sub-mount 720 as shown in FIG. 22. Further, it is also possible to arrange the two light emitting devices 500 so that the first electrodes 112 of the two light emitting devices 500 form the common electrode as shown in FIG. 23.

As shown in FIG. 18, the projector 800 further includes lens arrays 802R, 802G, and 802B, transmissive liquid crystal light valves (light modulation devices) 804R, 804G, and 804B, and a projection lens (a projection device) 808.

The lights emitted from the light sources 700R, 700G, and 700B enter the lens arrays 802R, 802G, and 802B, respectively. As shown in FIG. 19, each of the lens arrays 802 can have flat surfaces 801, which the lights 20, 22 emitted respectively from the light emitting sections 181, 186 enter, disposed on the light source 700 side. The flat surfaces 801 are disposed so as to correspond respectively to the plurality of light emitting sections 181, 186, and are arranged at regular intervals. Further, the normal line of the flat surface 801 is tilted with respect to the optical axes of the lights 20, 22. By the flat surface 801, the optical axes of the lights 20, 22 can be made perpendicular to an irradiation surface 805 of the liquid crystal light valve 804. In particular, in the case in which the angle α formed between the first side surface 131 and the first and third optical waveguides 160, 164 is not equal to 0° (see FIG. 1), since the lights 20, 22 emitted from the respective light emitting sections 181, 186 are tilted with respect to the perpendicular P1 of the first side surface 131, it is preferable that the flat surfaces 801 are provided.

The lens array 802 can have convex surfaces 803 on the liquid crystal light valve 804 side. The convex surfaces 803 are disposed so as to correspond respectively to the plurality of flat surfaces 801, and are arranged at regular intervals. The lights 20, 22 having the optical axes converted in the flat surface 801 are collected or reduced in diffusion angle by the convex surface 803, and can be overlapped (overlapped partially). Thus, it is possible to uniformly irradiate the liquid crystal light valve 804.

As described above, the lens array 802 can control the optical axes of the lights 20, 22 emitted from the light source 700 to thereby be collected or reduced in diffusion angle and overlapped.

As shown in FIG. 18, the lights collected by the lens arrays 802R, 802G, and 802B enter the liquid crystal light valves 804R, 804G, and 804B, respectively. The liquid crystal light valves 804R, 804G, and 804B respectively modulate the incident lights in accordance with image information. Then, the projection lens 808 magnifies the images formed by the liquid crystal light valves 804R, 804G, and 804B, and projects them on a screen (a display surface) 810.

Further, the projector 800 can include a cross dichroic prism (a colored light combining section) 806 for combining the lights modulated by the liquid crystal light valves 804R, 804G, and 804B and then guiding the combined light to the projection lens 808.

The three colored lights modulated by the respective liquid crystal light valves 804R, 804G, and 804B enter the cross dichroic prism 806. This prism is formed by bonding four rectangular prisms to each other, and is the rectangular prisms are provided with a dielectric multilayer film for reflecting the red light and a dielectric multilayer film for reflecting the blue light disposed so as to form a crisscross on the inside surfaces of the cross dichroic prism 806. The three colored lights are combined by these dielectric multilayer films to thereby form the light representing a color image. Then, the light thus combined is projected on the screen 810 by the projection lens 808 as the projection optical system, and thus an enlarged image is displayed.

The projector 800 has the light emitting devices 500 each having the plurality of light emitting sections the distance of which can be increased. Therefore, in the projector 800, alignment of the lens arrays 802 is easy and the liquid crystal light valves 804 can be uniformly irradiated.

It should be noted that although the transmissive liquid crystal light valves are used as the light modulation devices in the example described above, it is also possible to use light valves other than the liquid crystal light valves, or reflective light valves. As such light valves, there can be cited, for example, reflective liquid crystal light valves and the digital micromirror Device™. Further, the configuration of the projection optical system is appropriately modified in accordance with the type of the light valves used therein.

Further, the light source 700 and the lens array 802 can be formed as a module in alignment with each other. Further, it is also possible to form the light source 700, the lens array 802, and the light valve 804 as a module in alignment with each other. Further, it is also possible to apply the light source 700 also to the light source device of a scanning type image display device (a projector) having a scanning section as an image forming device for displaying an image with a desired size on a display surface.

The embodiment and the modified examples described above are each nothing more than an example, and the invention is not limited thereto. For example, it is also possible to arbitrarily combine the embodiment and the modified examples described above.

As described above, although the embodiment of the invention is hereinabove explained in detail, it should easily be understood by those skilled in the art that a number of modifications without substantially departing from the novel matters and the advantages of the invention are possible. Therefore, such modified examples should be included in the scope of the invention.

What is claimed is:

1. A light emitting device comprising:
   a first layer that generates light by an injection current; and
   a second layer and a third layer that sandwich the first layer and suppress leakage of the light,
   wherein the first layer is provided with:
      a first optical waveguide extending from a first light emitting section disposed on a first side surface of the first layer to a first light reflecting section disposed on a second side surface of the first layer,
      a second optical waveguide is extending from the first light reflecting section to a second light reflecting section disposed on a third side surface of the first layer, and
      a third optical waveguide is extending from the second light reflecting section to a second light emitting section disposed on the first side surface, and
   an element from one of group II or group XII of the periodic table of elements is diffused in the first light reflecting section and the second light reflecting section.

2. The light emitting device according to claim 1 wherein a surface of each of the first light reflecting section and the second light reflecting section is covered by a dielectric layer.

3. The light emitting device according to claim 2 wherein a resin layer is formed on an opposite side of the dielectric layer to each of the first light reflecting section and the second light reflecting section.

4. The light emitting device according to claim 1 wherein a surface of each of the first light reflecting section and the second light reflecting section is exposed.

5. The light emitting device according to claim 1 further comprising:
   a first electrode electrically connected to the second layer;
   a second electrode electrically connected to the third layer; and
   a fourth layer disposed between the third layer and the second electrode, and having ohmic contact with the second electrode,
   wherein, when viewed from a stacking direction of the first layer, the second layer, and the third layer,
   a shortest distance between the first light reflecting section and an end portion of a contact surface between the second electrode and the fourth layer is equal to or longer than 20 µm, and
   a shortest distance between the second light reflecting section and the end portion of the contact surface is equal to or longer than 20 µm.

6. The light emitting device according to claim 1 wherein when viewed from a stacking direction of the first layer, the second layer, and the third layer,
   the first optical waveguide and the second optical waveguide are connected to the first light reflecting section while being tilted at a first angle with a perpendicular of the second side surface,
   the second optical waveguide and the third optical waveguide are connected to the second light reflecting section while being tilted at a second angle with a perpendicular of the third side surface, and
   the first angle and the second angle are equal to or larger than a critical angle.

7. The light emitting device according to claim 1 wherein a length of the second optical waveguide in an extending direction of the second optical waveguide is longer than a length of the first optical waveguide in an extending direction of the first optical waveguide and a length of the third optical waveguide in an extending direction of the third optical waveguide.

8. The light emitting device according to claim 1 wherein each of the second side surface and the third side surface is an etched surface formed by etching.

9. The light emitting device according to claim 1 wherein the element is zinc.

10. An illumination device comprising:
    the light emitting device according to claim 1 wherein
    the light emitting device illuminates a light modulation device that modulates the incident light.

11. A projector comprising:
the light emitting device according to claim 1;
a lens array that reduces a diffusion angle of the light emitted from the light emitting device;
a light modulation device that modulates the light reduced the diffusion angle by the lens array in accordance with image information; and
a projection device that projects the image formed by the light modulation device.

12. A light emitting device comprising:
an active layer; and
a first cladding layer and a second cladding layer sandwiching the active layer,
wherein the active layer is provided with:
- a first gain region is extending from a first light emitting section disposed on a first side surface of the active layer to a first light reflecting section disposed on a second side surface of the active layer,
- a second gain region is extending from the first light reflecting section to a second light reflecting section disposed on a third side surface of the active layer, and
- a third gain region is extending from the second light reflecting section to a second light emitting section disposed on the first side surface, and an element from one of group II or group XII of the periodic table of elements is diffused in the first light reflecting section and the second light reflecting section.

13. An illumination device comprising:
the light emitting device according to claim 12 wherein
the light emitting device illuminates a light modulation device that modulates the incident light.

14. A super-luminescent diode comprising:
a first layer that generates light by an injection current; and
a second layer and a third layer that sandwich the first layer and suppress leakage of the light,
wherein the first layer is provided with:
- a first optical waveguide is extending from a first light emitting section disposed on a first side surface of the first layer to a first light reflecting section disposed on a second side surface of the first layer,
- a second optical waveguide is extending from the first light reflecting section to a second light reflecting section disposed on a third side surface of the first layer, and
- a third optical waveguide is extending from the second light reflecting section to a second light emitting section disposed on the first side surface, and an element from one of group II or group XII of the periodic table of elements is diffused in the first light reflecting section and the second light reflecting section.

15. An illumination device comprising:
a super-luminescent diode according to claim 14 wherein
the super-luminescent diode illuminates a light modulation device that modulates the incident light.

16. A projector comprising:
the super-luminescent diode according to claim 14;
a lens array that reduces a diffusion angle of the light emitted from the super-luminescent diode;
a light modulation device that modulates the light reduced the diffusion angle by the lens array in accordance with image information; and
a projection device that projects the image formed by the light modulation device.

* * * * *